US011906589B2

(12) United States Patent
Worry et al.

(10) Patent No.: US 11,906,589 B2
(45) Date of Patent: *Feb. 20, 2024

(54) SYSTEMS, METHODS, AND DEVICES FOR DETERMINING WHETHER A STATE-OF-CHARGE ESTIMATE OF AN ENERGY STORAGE SYSTEM IS TRACKING

(71) Applicant: Nuvation Research Corporation, Sunnyvale, CA (US)

(72) Inventors: Michael Worry, Campbell, CA (US); Stefan Janhunen, Waterloo (CA); Manoj Mathew, Kitchener (CA)

(73) Assignee: NUVATION RESEARCH CORPORATION, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/812,843

(22) Filed: Jul. 15, 2022

(65) Prior Publication Data

US 2022/0357400 A1    Nov. 10, 2022

Related U.S. Application Data

(63) Continuation of application No. 16/828,740, filed on Mar. 24, 2020, now Pat. No. 11,422,195.

(51) Int. Cl.
*G01R 31/382*    (2019.01)
*H02J 7/00*    (2006.01)
(Continued)

(52) U.S. Cl.
CPC ......... *G01R 31/382* (2019.01); *G01R 31/367* (2019.01); *G01R 31/396* (2019.01); *G06N 7/01* (2023.01); *H02J 7/0048* (2020.01)

(58) Field of Classification Search
CPC .. G01R 31/382; G01R 31/367; G01R 31/396; H02J 7/0048; G06N 7/005
(Continued)

(56) References Cited

U.S. PATENT DOCUMENTS 3,946,299 A    3/1976 Christianson et al.
4,021,718 A    5/1977 Konrad
(Continued)

OTHER PUBLICATIONS

Non-Final Office Action dated Nov. 23, 2021 in U.S. Appl. No. 16/828,740.
(Continued)

*Primary Examiner* — Lee E Rodak
*Assistant Examiner* — Trung Q Nguyen
(74) *Attorney, Agent, or Firm* — Snell & Wilmer L.L.P.

(57) ABSTRACT

Systems, methods, and devices are provided for estimating a state-of-charge in an energy storage system. The systems, methods, and devices may measure a current and a voltage related to the energy storage system, generate a model-based state-of-charge estimate based thereon, generate an aggregated state-of-charge estimate based on the model-based state-of-charge estimate, generate an adaptation current based on the measured current, aggregated state-of-charge estimate, and the adaptive state-of-charge estimate, and update the adaptive state-of-charge estimate based on the measured current and the adaptation current. The systems, methods, and devices may also provide a tracking indication whether the adaptive state-of-charge estimate is tracking between upper and lower confidence limits.

21 Claims, 10 Drawing Sheets

(51) Int. Cl.
*G06N 7/01* (2023.01)
*G01R 31/396* (2019.01)
*G01R 31/367* (2019.01)

(58) Field of Classification Search
USPC ...... 324/416, 425–434, 500, 522, 713, 72.5, 324/76.11, 76.39, 76.77, 98, 111, 120
See application file for complete search history.

(56) References Cited

U.S. PATENT DOCUMENTS

| | | | |
|---|---|---|---|
| 6,556,020 B1 | 4/2003 | McCabe et al. | |
| 11,422,195 B2* | 8/2022 | Worry | H02J 7/0048 |
| 2017/0012326 A1 | 1/2017 | Schaffner et al. | |
| 2017/0108906 A1* | 4/2017 | Chandra | H02J 7/0048 |
| 2017/0285109 A1* | 10/2017 | Kawamura | H02J 1/12 |
| 2021/0302505 A1 | 9/2021 | Worry et al. | |

OTHER PUBLICATIONS

Notice of Allowanced dated Apr. 22, 2022 in U.S. Appl. No. 16/828,740.

International Search Report and Written Opinion dated Jun. 11, 2021 in PCT International Patent Application No. PCT/US2021/022179.

International Preliminary Report on Patentability dated Sep. 22, 2022 in PCT International Patent Application No. PCT/US2021/022179.

* cited by examiner

Stack of Cells

Stack of Modules

SYSTEMS, METHODS, AND DEVICES FOR DETERMINING WHETHER A STATE-OF-CHARGE ESTIMATE OF AN ENERGY STORAGE SYSTEM IS TRACKING

CROSS-REFERENCE TO RELATED APPLICATION

This application is a continuation of and claims priority to U.S. application Ser. No. 16/828,740, filed Mar. 24, 2020 and titled "SYSTEMS, METHODS, AND DEVICES FOR STATE-OF-CHARGE ESTIMATION IN ENERGY STORAGE SYSTEMS". The contents of the foregoing application is hereby incorporated by reference for all purposes (except for any subject matter disclaimers or disavowals, and except to the extent that the incorporated material is inconsistent with the express disclosure herein, in which case the language in this disclosure controls).

FIELD OF INVENTION

The present disclosure relates generally to energy storage system charging and discharging and, in particular, to state-of-charge estimation in energy storage systems ("EES").

BACKGROUND

State-of-charge ("SOC") may be a level of charge of an energy storage system relative to the energy storage system's capacity. For example, state-of-charge may be a level of charge of a battery relative to the battery's capacity. State-of-charge may be expressed as a percentage of the energy storage system's capacity, e.g., 0% may be completely discharged and 100% may be fully charged. Other useful measures of storage capacity, such as depth of discharge or remaining energy, may be derived from a SOC estimate. In the past, various SOC estimation techniques have been used, including traditional coulomb counting and model-based approaches.

Traditional coulomb counting involves estimating the SOC of an energy storage system by measuring the battery current flowing, into and out of the battery, and integrating that measured battery current, over time. In this approach, an initial state-of-charge value is required and this value is updated recursively based on the charge going in and out of the battery. Because traditional coulomb counting may continually perform accumulation, errors may increase over time. For example, if each accumulation operation has an error, and if these errors do not cancel each other out, the total error, i.e., the summation of the errors, may accumulate over time. After a period of accumulation, the accuracy of estimation may be substantially affected, resulting in long-term drift. Additionally, an incorrect initial state-of-charge value will produce estimates that consistently differ from the true value, and is another source of error for traditional coulomb counting. Therefore, traditional coulomb counting is not sufficient for accurate state-of-charge estimation.

In addition, there are a number of model-based approaches that are used to try to estimate battery state-of-charge. An example may use a recursive Bayesian filter. This algorithm refers to any probabilistic approach that recursively updates a given probability distribution based on measurement samples and a mathematical process model. The recursive Bayesian estimation may be based on the Bayesian approach, where the prior belief of a state may be continuously updated based on new measurements. An example of this is an extended Kalman filter, where the process and measurement noise may be assumed to be normally distributed. The recursive Bayesian estimation term may also refer to other probabilistic approaches such as a particle filter, where the noise distributions may be non-Gaussian. Although these approaches may sometimes provide accurate state-of-charge estimates, the stochastic nature of these approaches may prevent the state-of-charge from tracking with the external physical behavior of the battery system. For example, a model-based state-of-charge approach might gradually increase the state-of-charge even while the battery is at rest. Model-based approaches may also suffer from short-term accuracy issues due to model inaccuracies and measurement errors.

Systems, methods, and devices that track with the external physical behavior of the battery system, correct for long-term drift, or both track with the external physical behavior of the battery system and correct for long-term drift may be desirable. Moreover, since SOC may be one of the most important ESS metrics an operator or external control system may rely on, an SOC estimate which is accurate and that tracks with external physical behavior may be desirable.

SUMMARY

In an example embodiment, a method of estimating a state-of-charge in an energy storage system, comprises: measuring a current related to the energy storage system to ascertain a measured current; measuring a voltage related to the energy storage system to ascertain a measured voltage; determining a model-based state-of-charge estimate for the energy storage system based on the measured current and the measured voltage; determining an aggregated state-of-charge estimate based upon the model-based state-of-charge estimate; determining an adaptation current for the energy storage system based on the measured current, the aggregated state-of-charge estimate and an adaptive state-of-charge estimate; and determining the adaptive state-of-charge estimate based on the adaptation current and the measured current.

In an example embodiment, a device for estimating a state-of-charge in an energy storage system, may comprise: a current measurement circuit to measure a current related to the energy storage system to ascertain a measured current; a voltage measurement circuit to measure a voltage related to the energy storage system to ascertain a measured voltage; an estimator module to generate a model-based state-of-charge estimate based on the measured current and the measured voltage; an aggregation module to generate an aggregated state-of-charge estimate based on the model-based state-of-charge estimate; an adaptation module to generate an adaptation current based on the measured current, the aggregated state-of-charge estimate, and an adaptive state-of-charge estimate; an accumulation module to update the adaptive state-of-charge estimate based on the measured current and the adaptation current.

In an example embodiment, a system comprises an energy storage system, and a device for generating an adaptive state-of-charge estimate for the energy storage system, the device comprising: a current measurement circuit configured to measure a current related to the energy storage system to ascertain a measured current; a voltage measurement circuit configured to measure a voltage related to the energy storage system to ascertain a measured voltage; an estimator module to generate a model-based state-of-charge estimate based on the measured current and the measured voltage; an aggregation module to generate an aggregated state-of-charge estimate based on the model-based state-ofcharge estimate and the measured current; an adaptation module to generate an adaptation current based on the measured current, the aggregated state-of-charge estimate, and the adaptive state-of-charge estimate; and an accumulation module to update the adaptive state-of-charge estimate based on the measured current and the adaptation current.

BRIEF DESCRIPTION OF THE DRAWING FIGURES

Additional aspects of the present disclosure will become evident upon reviewing the non-limiting embodiments described in the specification and the claims taken in conjunction with the accompanying figures, wherein like numerals designate like elements, and:

DETAILED DESCRIPTION

Figure 1A:
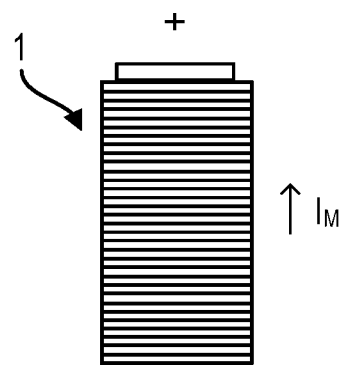
FIG. 1A is a diagram illustrating an example energy storage cell.

Reference will now be made to the exemplary embodiments illustrated in the drawings, and specific language will be used herein to describe the same. It will nevertheless be understood that no limitation of the scope of the disclosure is thereby intended. Alterations and further modifications of the inventive features illustrated herein, and additional applications of the principles of the disclosure as illustrated herein, which would occur to one skilled in the relevant art and having possession of this disclosure, are to be considered within the scope of the disclosure.

In accordance with an example embodiment, systems, devices and methods are provided for providing state-of-charge estimation in an energy storage system.

Energy Storage System (ESS)

In accordance with various example embodiments, an energy storage system ("ESS") is a system that stores and releases electrical charge. The ESS may comprise electrochemical cells, such as lead-acid batteries, nickel-cadmium batteries, nickel-metal hydride batteries, lithium-ion batteries, lithium-ion polymer batteries, zinc-air batteries, and/or the like. In another example embodiment, the ESS may comprise flow batteries. In yet another example embodiment, the ESS may comprise super-capacitors. Moreover, the ESS may comprise any suitable rechargeable energy storage system for which SOC estimation is relevant.

Cell

In the various example embodiments described herein, and with reference to FIG. 1A, an ESS may comprise, in an example embodiment, a battery cell 1, or simply "cell" for short. In an example embodiment, the cell 1 comprises a single anode and cathode separated by electrolyte and is used to store and release electrical charge. However, other cell designs may also be used, such as in flow batteries. Multiple anodes and cathodes may be joined together in parallel or series arrangements to produce cells that operate at higher voltage or current levels. The cell may be the smallest measurable unit of energy storage within an ESS. The current flowing through the cell 1 is denoted $I_M$, where a positive current flows out of the positive terminal. A typical cell can be physically arranged as a cylindrical cell, such as the 18650 and 21700 cylindrical lithium-ion format cells, button cells, prismatic cells, pouch cells, and/or the like. In another example embodiment, a cell may comprise a super-capacitor. Moreover, a cell may comprise any chemistry and format suitable for rechargeable energy storage where SOC estimation is relevant. Generally, the cell 1 may be any rechargeable energy storage device with connection points for a single voltage measurement. The systems, methods, and devices described herein may provide improved SOC estimation for the cell 1.

Module

Figure 1B:
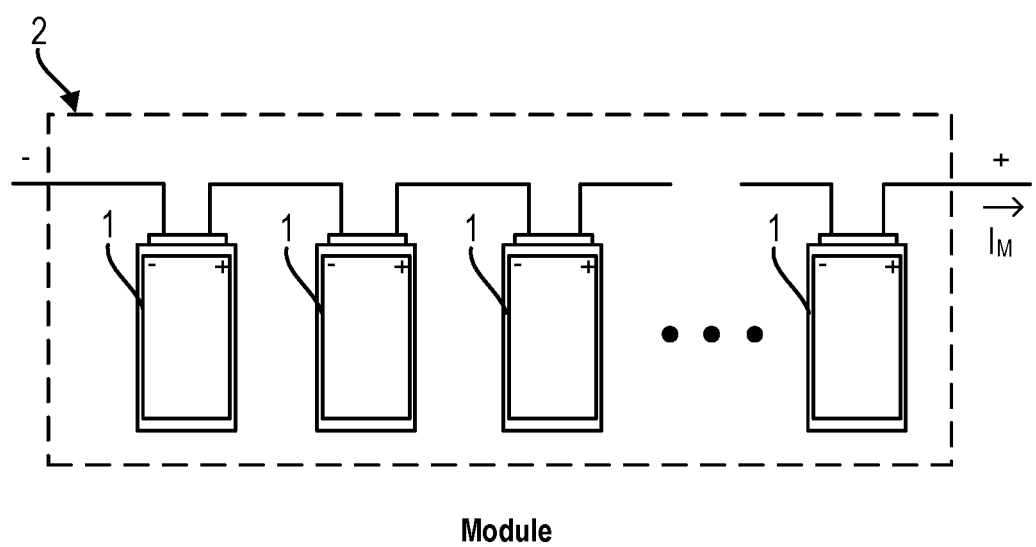
FIG. 1B is a diagram illustrating an example energy storage module.

Moreover, an ESS may comprise, in an example embodiment, and with reference to FIG. 1B, a battery module 2, or simply "module" for short. A module 2 may comprise two or more cells connected in series or parallel arrangements or both series and parallel arrangements and grouped together. In one example embodiment, a lead-acid automotive battery comprises a module that is made-up of six cells with only two connection points for overall voltage measurement. In another example embodiment, a lithium-ion battery module comprises a module with 12 series connected cells, each with individual connection points for cell voltage measurement. A module 2 may be the smallest measurable unit in the ESS, if the individual cells are integrated into the module in such a way that measurement of voltage from the individual cells is not convenient. The current flowing through the module 2 is denoted $I_M$, where a positive current flows out of the most positive cell terminal. Moreover, a module can be any energy storage device comprising a group of two or more cells with connection points for one or more voltage measurement(s). The systems, methods, and devices described herein may provide improved SOC estimation for the module 2.

Stack

Figure 1C:
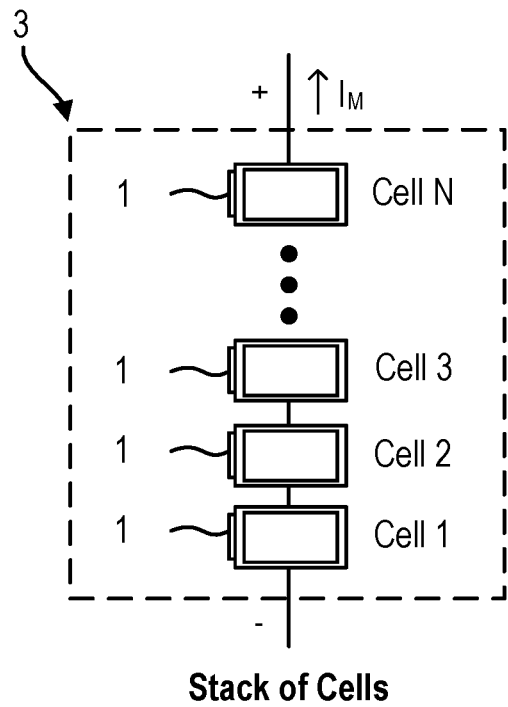
FIG. 1C is a diagram illustrating an example energy storage stack of cells.
Figure 1D:
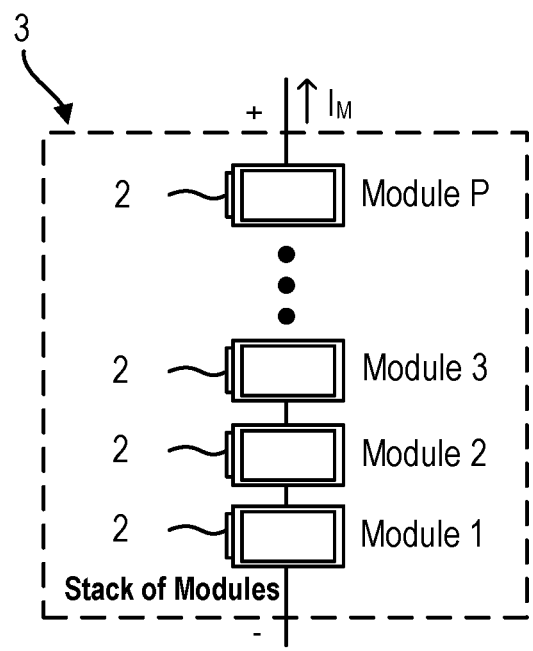
FIG. 1D is a diagram illustrating an example energy storage stack of modules.

Moreover, an ESS may comprise, in an example embodiment, and with reference to FIG. 1C, a battery stack 3, or simply "stack" for short. The stack 3, in an example embodiment, comprises multiple cells 1 electrically connected in series. Thus, in an example embodiment, a stack 3 may comprise N cells, and the cells may be noted as cell n wherein n=1 to N. It will be understood that N may be any positive integer number. For N=1 the stack is a single cell. For N>1, the stack is a number of cells, N. In another example embodiment, and with reference to FIG. 1D, the stack 3, comprises multiple modules 2 electrically connected in series. Thus, in an example embodiment, a stack 3 may comprise P modules, and the modules may be noted as module p, wherein p=1 to P. It will be understood that P may be any positive integer number. For P=1 the stack is a single module. For P>1, the stack is a number of modules, P. The current flowing through the stack 3 is denoted $I_M$, where a positive current flows out of the most positive cell or module terminal. The systems, methods, and devices described herein may provide improved SOC estimation for the stack 3.

Bank

Figure 1E:
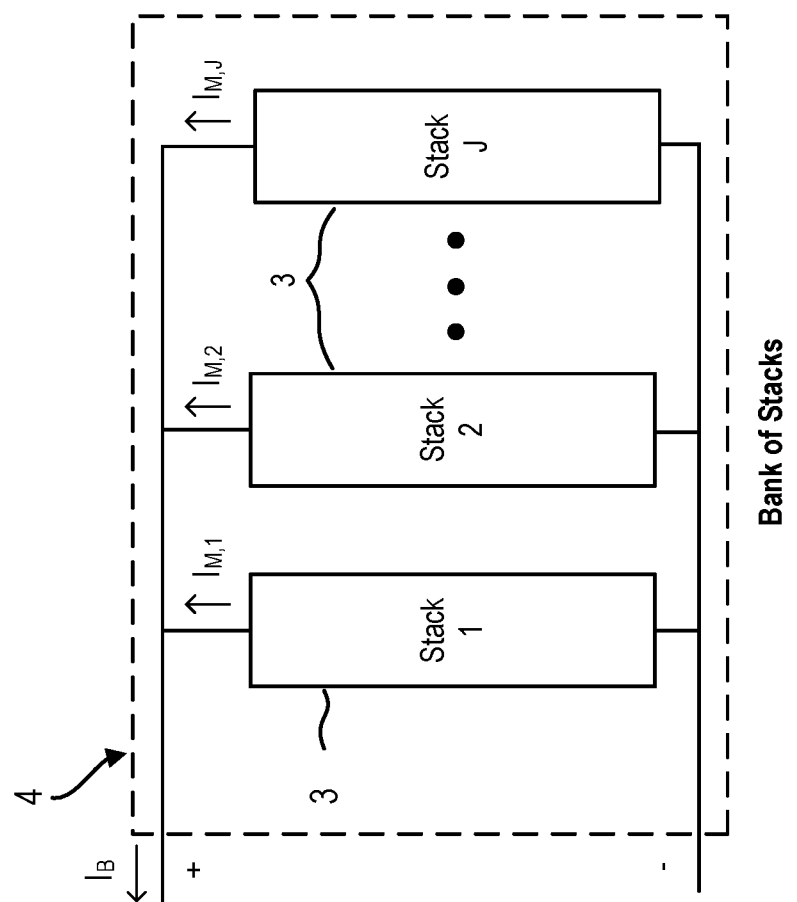
FIG. 1E is a diagram illustrating an example energy storage bank of stacks.

Moreover, an ESS may comprise, in an example embodiment, and with reference to FIG. 1E, a battery bank 4, or simply "bank" for short. The bank 4, in an example embodiment, comprises multiple stacks 3, electrically connected in parallel. Thus, in an example embodiment, a bank 4 may comprise J stacks, and the stacks may be noted as stack j, wherein j=1 to J. It will be understood that J may be any positive integer number. For J=1 the bank is a single stack. For J>1, the bank is a number of stacks, J. The current flowing through the bank 4 is denoted $I_B$, which is also electrically equivalent to the sum of the individual stack currents $I_{M, 1 \ldots J}$. The number of stacks included within the bank 4 may change over time dynamically if one or more stack(s) can be connected or disconnected from the bank using contactors, circuit breakers, solid-state switches, or any other suitable means of making or breaking current flow. The systems, methods, and devices described herein may provide improved SOC estimation for the bank 4.

SOC Estimation System

In an example embodiment, a SOC estimation system, devices and methods are provided for accurately estimating the SOC at one or more of the cell, module, stack, and bank levels. The SOC estimation may produce a well-behaved state-of-charge metric. A well-behaved state-of-charge metric may be one where (1) state-of-charge approaches approximately 0% when no more charge can be removed from the ESS, (2) state-of-charge approaches approximately 100% when no more charge can be accepted by the ESS, (3) during charge, the state-of-charge only increases, (4) during discharge, the state-of-charge only decreases, (5) during rest, the state-of-charge either remains constant or decreases slightly, e.g., due to self-discharge, and (6) during operation, the changes in state-of-charge are proportional to the measured charge flow into or out of the ESS. For the reasons mentioned above, obtaining a well-behaved SOC metric can be difficult if prior art techniques are being used.

In an example embodiment, a SOC estimation system is implemented, at one or more of the cell, module, stack and bank levels, with coulomb counting. In various example embodiments, the SOC estimation system comprises adaptive coulomb counting and/or model tracking. In an example embodiment, the SOC estimation system is configured to measure a current related to the energy storage device, to determine an adaptation current for the energy storage device, and to estimate the state-of-charge in the energy storage device based on the measured current and the adaptation current through use of adaptive coulomb counting. In an example embodiment, the adaptation current is based on a comparison of an adaptive SOC estimate and a model-based SOC estimate. In another example embodiment, the SOC estimation system is configured to determine statistical confidence limits, to use those statistical confidence limits to detect sudden changes in SOC, and to use a tracking indicator to signify when the SOC estimate may be inaccurate.

In another example embodiment, the well-behaved SOC estimate may be used to calculate other measures of storage capacity for an energy storage system. For example, a depth of discharge may be calculated from a well-behaved SOC estimate and a total ESS charge capacity. As another example, a remaining energy capacity may be calculated from a well-behaved SOC estimate, a total ESS energy capacity, and measured or estimated voltage.

Figure 1F:
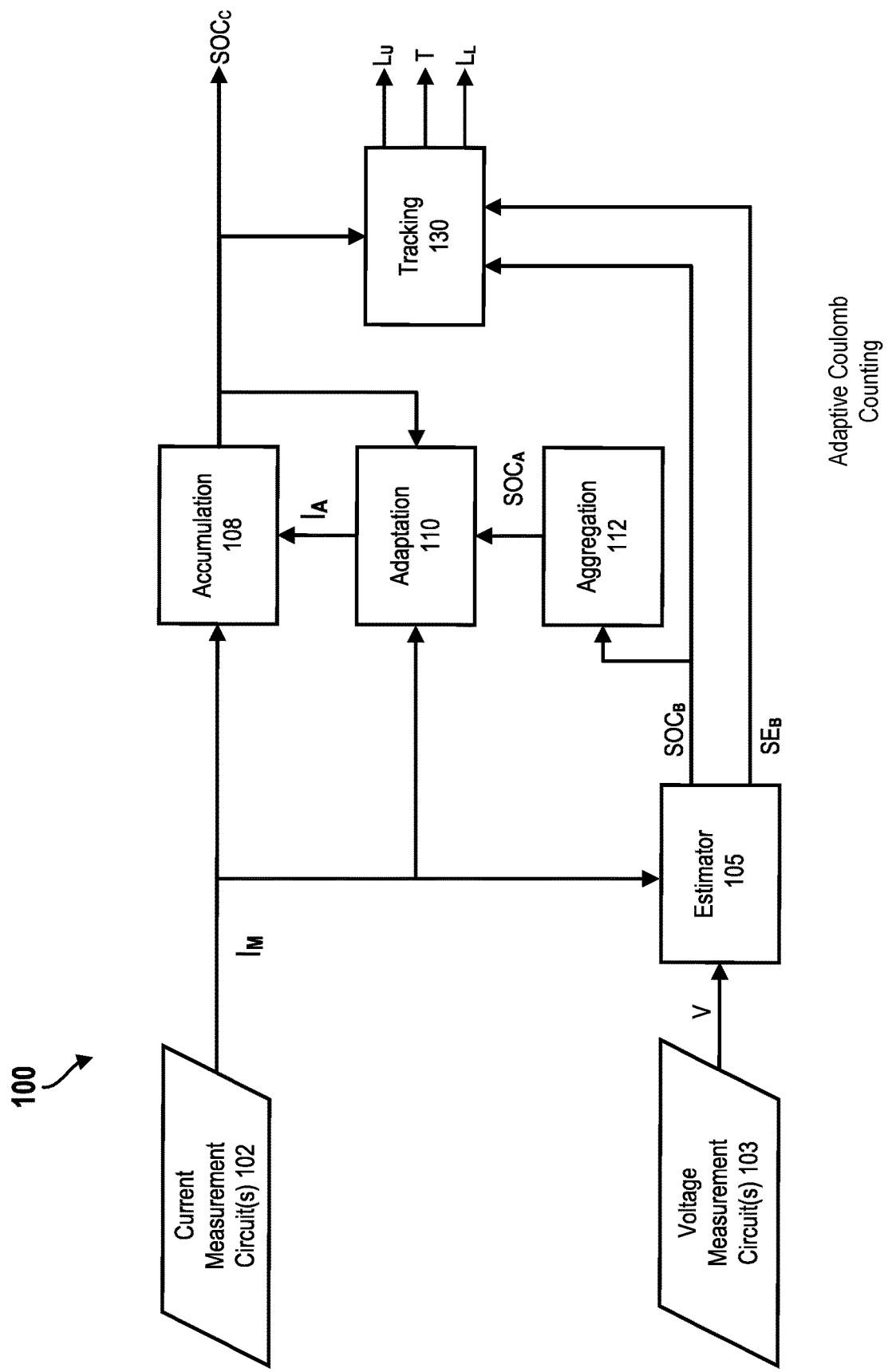
FIG. 1F is a block diagram illustrating an example state-of-charge estimation system at a general level.

FIG. 1F is a block diagram illustrating an example state-of-charge estimation system 100 illustrating generically how the SOC estimation in an ESS can be applied (whether it be at the cell, module, stack or bank level). The system 100 may further comprise a current measurement module 102. The system 100 may further comprise a voltage measurement module 103 and an estimator module 105. In an example embodiment, the system 100 further comprises an aggregation module 112. The system 100, in an example embodiment, comprises an adaptation module 110 and an accumulation module 108. In another example embodiment, the system 100 further comprises a tracking module 130.

In an example embodiment, the current measurement module 102 may comprise, for example, a current measurement circuit. In an example embodiment, the current measurement module 102 may comprise a current sensor, such as a hall effect sensor, a current shunt, or the like. The current sensor may be located convenient to measuring the current into or out of a cell, module, stack, or bank in an ESS. In an example embodiment, the current measurement module 102 can be any suitable current measurement device that is configured to measure a current (into or out of a single cell, module, stack or bank) and to generate a measured, actual current $I_M$, representing the cell, module, stack or bank current measurements. The current measurement $I_M$ may be provided to one or more of the accumulation module 108, adaptation module 110, and estimator module 105. In accordance with various example embodiments, this description of the current measurement module 102 may be equally applicable to the current measurement modules 202, 302, 402, 502, and 602 of FIGS. 2-6.

In an example embodiment, the voltage measurement module 103 may comprise, for example, a voltage measurement circuit. In an example embodiment, the voltage measurement module 103 may comprise a voltage sensor, such as a capacitive voltage sensor, a resistive type voltage sensor, or the like. The voltage sensor may be located convenient to measuring the voltage across a cell or across one or more portions of a module in an ESS. In an example embodiment, the voltage measurement module 103 can be any suitable voltage measurement device that is configured to measure a voltage and to generate a measured voltage, V, representing the voltage across a cell or across one or more portions of a module. In accordance with various example embodiments, this description of the voltage measurement module 103 may be equally applicable to the voltage measurement modules 203, 303, and 403 of FIGS. 2-4.

In an example embodiment, an estimator module 105 is configured to receive the measured current $I_M$ and measured voltage V and to generate an estimator output. The estimator output, in one example embodiment, is a model-based SOC estimate, $SOC_B$. The estimator output, in accordance with another example embodiment is a model-based standard error estimate, $SE_B$. In various example embodiments, the estimator output comprises both the $SOC_B$ and the $SE_B$. The estimator module 105 may provide the model-based SOC estimate, $SOC_B$, to the aggregation module 112, and/or to the tracking module 130. The estimator module 105 may provide the model-based standard error estimate, $SE_B$, to the tracking module 130.

In an example embodiment, the estimator module 105 may be configured to generate the model-based SOC estimate, $SOC_B$, based on a model, the measured current $I_M$ and measured voltage V. In an example embodiment, the model is a cell model. Input into the cell model may be the measured current, $I_M$, which is used to predict the terminal voltage. For example, the estimator module 105 may use an equivalent circuit model with an open circuit voltage model, a resistor element and one resistor-capacitor pair element. Moreover, any suitable cell model may be used to predict the terminal voltage. The estimator may use the difference between the predicted terminal voltage and the measured voltage, V, to update the model-based SOC estimates.

The estimator module 105 may recursively update a vector of cell states and their corresponding covariance matrices using the cell model. The cell state-of-charge is one of those states. For example, the estimator may use recursive Bayesian estimation techniques to generate a probability distribution representing the probability that the estimated model-based SOC, $SOC_B$, is accurate. In an example embodiment, the probability distribution is created at each time step, k. Moreover, any suitable estimation techniques may be used to generate the probability distribution. Moreover, any suitable filtering techniques may be used to address noise in the measurements. An example recursive Bayesian estimation algorithm starts with an initial guess of the cell states and the covariance matrices. This initial guess may be based upon measured voltage and the open circuit voltage model, empirically chosen constants, or any other suitable method of initialization. Then, at every time step, the states and covariance are changed based on the state update and the measurement update.

State update: The cell model along with the measured current is used to predict the cell states at each discrete time step. In addition, the uncertainty in this prediction step, which is a combination of the uncertainty in the cell model and the uncertainty in the current, is used to predict the covariance matrix of the cell states.

Measurement update: The cell model along with the measured voltage, V, is used to correct the cell states and the covariance matrices at each discrete time step. The size of this correction step depends on the uncertainty of the measured voltage, V, and the uncertainty in the cell states.

As previously mentioned, one of the elements in the state vector is the cell state-of-charge, and the value obtained after measurement update represents the optimal estimate in the presence of noise. For n number of cells, there will be a vector of n SOC values and n covariance values. For a given probability distribution, the standard error can be calculated by taking the square-root of the variance. Moreover any suitable filter model can be used to generate the model-based SOC estimate, $SOC_B$ and to generate the model-based standard error estimate, $SE_B$.

Figure 2:
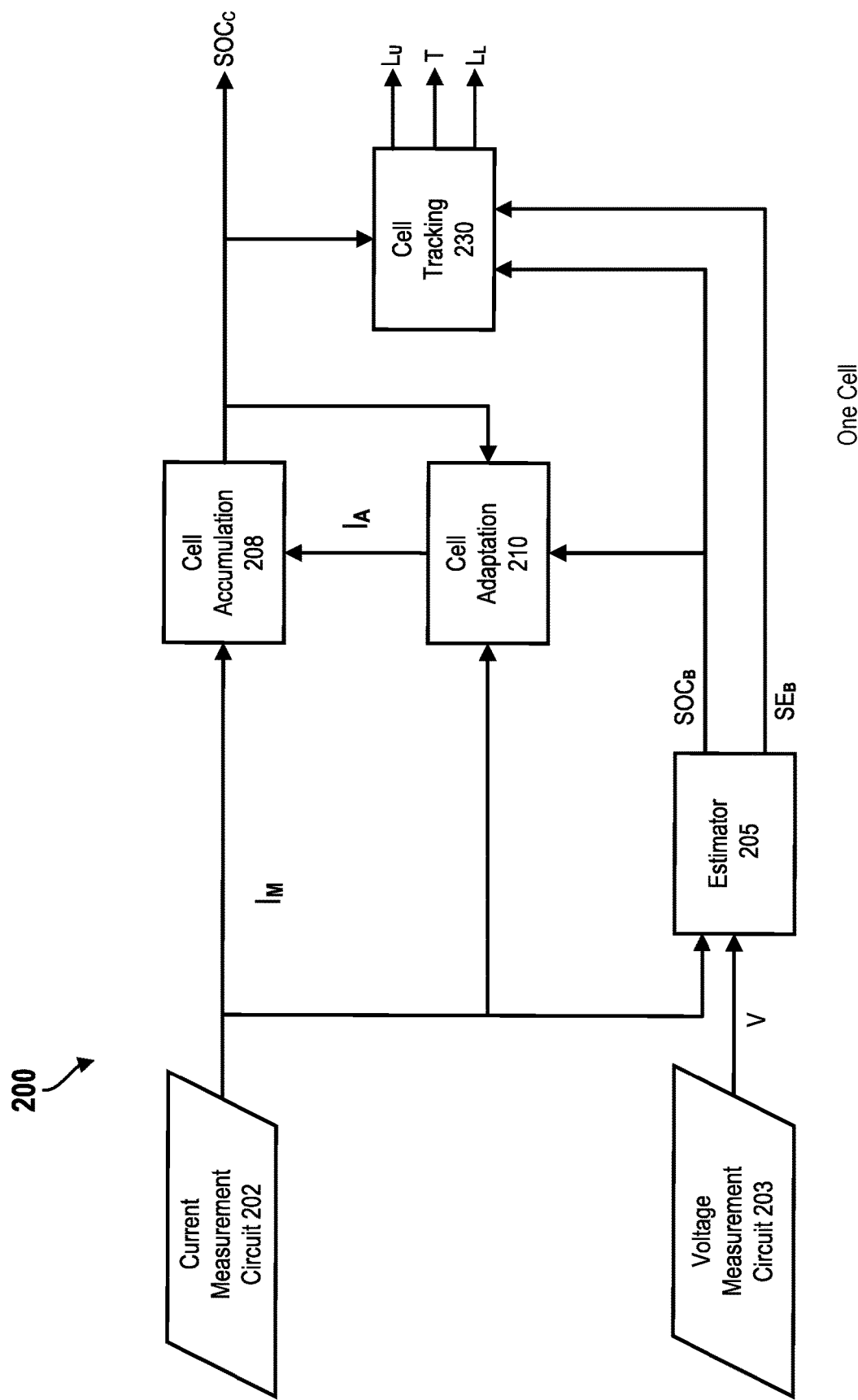
FIG. 2 is a block diagram illustrating an example state-of-charge estimation system for use with a single cell.
Figure 3:
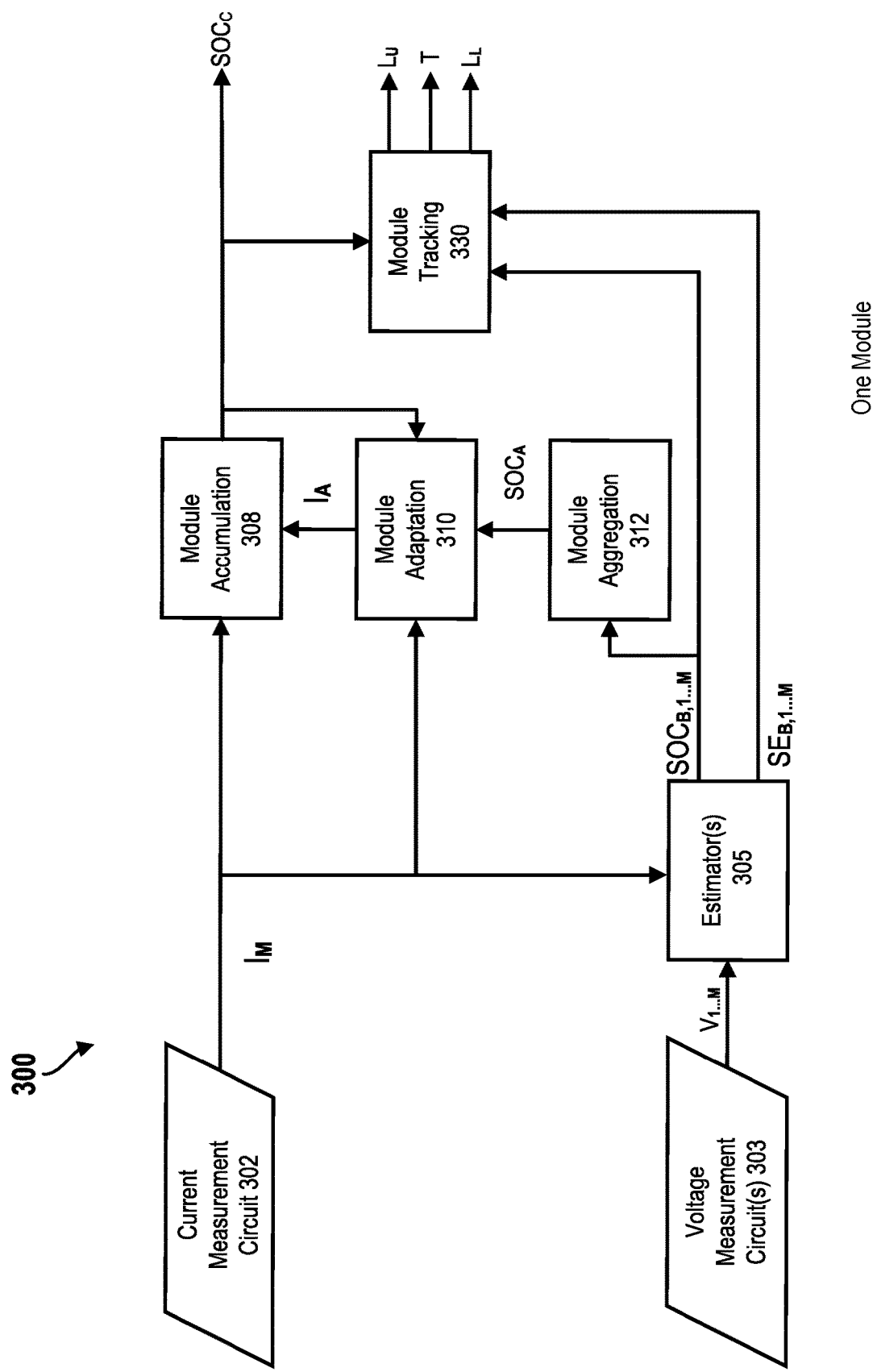
FIG. 3 is a block diagram illustrating an example state-of-charge estimation device for a single module.
Figure 4:
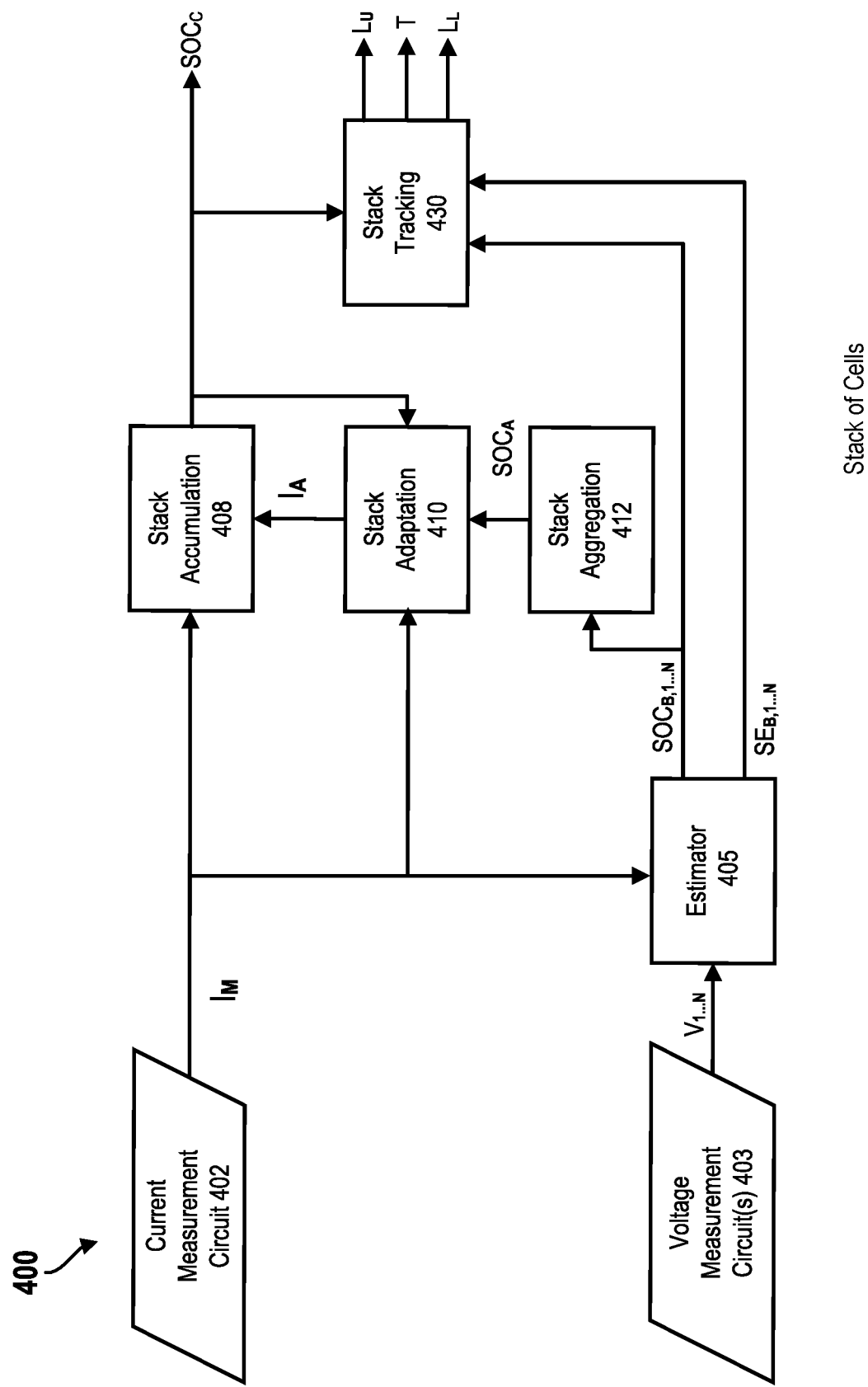
FIG. 4 is a block diagram illustrating an example state-of-charge estimation device for a stack of cells.

In accordance with various example embodiments, this description of the estimator module 105 may be equally applicable to the estimator modules 205, 305, and 405 of FIGS. 2-4.

In an example embodiment, aggregation module 112 is configured to receive the model-based SOC estimate, $SOC_B$ and to generate an aggregated SOC estimate, $SOC_A$. In an example embodiment, aggregation module 112 may be configured to provide the aggregated SOC estimate, $SOC_A$, to adaptation module 110. In an example embodiment, aggregation module 112 is configured to generate the aggregated SOC estimate, $SOC_A$, based on the model-based SOC estimate, $SOC_B$. For example, aggregation module 112 may calculate the aggregated SOC estimate, $SOC_A$, by taking the ratio of the remaining charge in the ESS to the total capacity of the ESS. In another example embodiment, the aggregation module 112 receives aggregated SOC estimates $SOC_{A.1...N}$ from a lower level (e.g., the aggregation module for a stack of modules or bank of stacks may receive SOC estimates, $SOC_{A.1...N}$, from the $SOC_A$ outputs of the lower level), and generates a single aggregated SOC estimate, $SOC_A$, for the stack of modules or bank of stacks. Moreover, aggregation module 112 may generate the aggregated SOC estimate, $SOC_A$, using any suitable technique that creates an aggregated SOC estimate based on model-based SOC estimate(s).

It is noted that in one example embodiment, the aggregation module 112 can pass through the $SOC_B$ to the $SOC_A$. Alternatively, system 100 may omit the aggregation module 112 to similar effect. Omitting aggregation module 112 or passing the model-based SOC estimate, $SOC_B$, through to the adaptation module 110 may be most useful in the case where just a single cell is being measured and its SOC is being estimated.

In an example embodiment, the adaptation module 110 is configured to receive the measured current $I_M$ from the current measurement module 102, (e.g., a current measurement circuit) to receive an adaptive SOC estimate, $SOC_C$, to receive an aggregated SOC estimate, $SOC_A$, and to generate an adaptation current $I_A$. In an example embodiment, the model-based SOC estimate, $SOC_B$, and the aggregated SOC estimate, $SOC_A$, are both model-based SOC estimates. Thus, although described from here forward as the adaptation module 110 receiving the aggregated SOC estimate, $SOC_A$, it should be understood that each such embodiment, under the appropriate circumstances, could involve the adaptation module 110 receiving the model-based SOC estimate, $SOC_B$.

The adaptation current $I_A$ may be provided to the accumulation module 108. In an example embodiment, the adaptation current $I_A$ is generated based on the measured current $I_M$, the previous adaptive SOC estimate, $SOC_C$, and the aggregated SOC estimate, $SOC_A$. In an example embodiment, the adaptation current $I_A$ is generated to account for SOC drift due to current measurement error and ESS self-discharge. In an example embodiment, a portion of the adaptation current $I_A$ accounts for measurement error. This portion can be a fraction of the measured current, $I_M$. The fraction is based on the difference between the adaptive SOC estimate $SOC_C$ and the aggregated SOC estimate, $SOC_A$ and a tunable gain constant. In an example embodiment, another portion of the adaptation current $I_A$ accounts for ESS self-discharge. This self-discharge portion is taken to be a fraction of the equivalent self-discharge current. The self-discharge current is based on unwanted side reactions within a cell in addition to the power draw of the battery management system. The value of the self-discharge current may be modeled or tuned based on experimental findings. The fraction is based on the difference between the adaptive SOC estimate $SOC_C$ and the aggregated SOC estimate $SOC_A$ and a second tunable constant. Both tunable constants may be selected and tested over a period of time to determine any impact on long term drift. Adjustments may be made to determine the correct constants to use, e.g., a constant may be selected that leads to correct results over a test period.

In accordance with various example embodiments, this description of the adaptation module 110 may be equally applicable to the adaptation modules 210, 310, 410, 510, and 610 of FIGS. 2-6. Thus, in accordance with various example embodiments, an adaptation module is configured to output an adaptation current, $I_A$, to accumulation module 108, that can adjust the SOC estimate to generate a well-behaved state-of-charge estimate.

In an example embodiment, the accumulation module 108 is configured to receive the measured current $I_M$, and the adaptation current $I_A$ and to generate the adaptive SOC estimate, $SOC_C$. The adaptive SOC estimate, $SOC_C$, may be provided to the adaptation module 110 and to the tracking module 130. The accumulation module 108 may generate the adaptive SOC estimate, $SOC_C$, based on the measured current $I_M$ and the adaptation current $I_A$. For example, the adaptive SOC estimate $SOC_C$ may be generated by summing the measured current $I_M$ and the adaptation current $I_A$. Moreover, the adaptive SOC estimate $SOC_C$ may be generated using any suitable formula based on the measured current $I_M$, and the adaptation current $I_A$ that adjusts the $SOC_C$ to account for differences between $SOC_A$ and $SOC_C$ while tracking with the external behavior of the system. In an example embodiment, accumulation module 108 is configured to use coulomb counting, in combination with the adaptation current $I_A$, which is described herein as adaptive coulomb counting. In an example embodiment, similar to traditional coulomb counting, the initial value for $SOC_C$ is chosen at initialization time. This initial guess may be based upon the aggregated SOC estimate, an empirically chosen constant, or any other suitable method of initialization. In an example embodiment, unlike traditional coulomb counting, errors in this initial guess may be gradually tracked out of the adaptive SOC estimate in a well-behaved manner as the ESS is operated.

In accordance with various example embodiments, this description of the accumulation module 108 may be equally applicable to the accumulation modules 208, 308, 408, 508, and 608 of FIGS. 2-6.

In an example embodiment, the tracking module 130 is configured to receive the model-based SOC estimate(s), $SOC_B$, the model-based standard error estimate(s), $SE_B$, and the adaptive SOC estimate, $SOC_C$, and to generate an upper confidence limit $L_U$, a lower confidence limit, $L_L$, and an overall tracking indicator T. Thus, in accordance with various example embodiments, statistical confidence limits are used to detect whether the estimated state-of-charge value is tracking accurately. Moreover, the tracking indicator T may identify sudden, unexpected changes in the model-based SOC estimate(s) due to faults or maintenance actions. The tracking indicator T may also be used to alert operators or control systems that the adaptive SOC estimate is inaccurate.

When a vector of standard errors and SOC estimates are used, the upper and lower limits are based on the first cell to discharge to empty and the first cell to charge to full.

In accordance with various example embodiments, the various modules described herein may each represent a single process or element in the system that accepts inputs, transforms them as described, and generates outputs. A module may be implemented within a circuit (digital or analog ASICs, discrete components, FPGAs, CPLDs, etc.) or within a software/firmware routine.

Problems to be Solved in Obtaining Well-Behaved SOC Estimates

As discussed above, the systems and methods described herein may be applied to generate a well-behaved state-of-charge estimate. There are at least three scenarios where a well-behaved state-of-charge estimate cannot be reliably achieved using the classic adaptive filtering methods: (1) illogical or inaccurate behavior due to errors in the battery model, (2) a fault in any voltage or current sensor within the system leading to erroneous measurements, or (3) changes in energy storage system capacity during operation or maintenance.

Errors in the Battery Model

During normal operation, state-of-charge estimates determined from model-based approaches may behave illogically or inaccurately due to errors in the battery model. This may be especially likely for chemistries that have a flat open-circuit voltage curve because even small modeling errors may result in a large state-of-charge swing. Errors in model-based estimators may also be temporarily present due to inaccuracies during state initialization. In accordance with various embodiments, however, the example systems and methods described herein are grounded in an adaptive coulomb counting approach with an adaptation current feedback, and a well-behaved state-of-charge is obtained.

Sensor Faults

Model-based approaches may use voltage measurements to recursively update the state-of-charge estimate over time. When there is a fault in any voltage sensor on any cell within the system, erroneous voltage measurements could be produced, leading to an inaccurate and illogical state-of-charge estimate. Furthermore, faults in a current sensor may cause the adaptive SOC estimate to diverge from the model-based SOC estimate. Once again, the proposed systems and methods may ensure that sudden, erroneous changes in state-of-charge do not occur. In accordance with an example embodiment, the system is configured to generate a tracking indicator to alert an operator or external control system that a discrepancy has been detected.

Changes in Energy Storage System Capacity

During operation and maintenance of large-scale energy storage systems, the capacity may change due to a number of conditions. For example, dynamic disconnection and reconnection of individual battery stacks within a battery bank may change the ESS capacity. In another example, passive or active balancing at the cell or module level may change the ESS capacity. Moreover, any capacity changes introduced into the system may rapidly change the model-based SOC estimate(s). But, in accordance with various example embodiments, the adaptive state-of-charge estimate may remain well-behaved even while the energy storage system capacity changes. Over time, the adaptive state-of-charge estimate is adjusted based upon model feedback until the change in capacity is accounted for in a well-behaved manner.

The state-of-charge estimate for a battery may be an especially important parameter for operators as well as higher-level energy management systems (EMS) and control systems. The proposed approach may maintain a well-behaved state-of-charge estimate during normal ESS operation. Under abnormal conditions, the tracking indicator may signal whether the adaptive SOC estimate is accurately tracking the expected model. Furthermore, when the adaptive SOC estimate is not tracking the expected model, it may not always satisfy all of the conditions for a well-behaved SOC metric.

FIG. 2 is a block diagram illustrating an example state-of-charge estimation system for use with a single cell. A single cell SOC estimation system 200 is illustrated in the context of measuring the current and voltage of a single cell and estimating the SOC of that single cell. In an example embodiment the single cell SOC estimation system 200 comprises a current measurement module 202, voltage measurement module 203, cell accumulation module 208, cell adaptation module 210, cell tracking module 230, and estimator module 205.

In an example embodiment, the current measurement module 202 is configured to measure a current flowing through a single cell and to generate a measured current $I_M$. The current measurement module 202 may provide the measured current $I_M$ to cell accumulation module 208, cell adaptation module 210, and estimator module 205. In an example embodiment, voltage measurement module 203 is configured to measure a voltage across a single cell and to generate a measured voltage V. The voltage measurement module 203 may provide the measured voltage across a cell to the estimator module 205.

The estimator module 205 may be configured to receive the current measurement (measured current $I_M$) and voltage measurement (measured voltage V) and to generate a model-based SOC estimate, $SOC_B$, and a model-based standard error, $SE_B$, similar to how such generation is discussed herein with reference to estimator module 105. The estimator module 205 may provide the model-based SOC estimate, $SOC_B$, to the cell adaptation module 210 and the cell tracking module 230. The estimator module 205 may provide the model-based standard error, $SE_B$, to the cell tracking module 230.

In an example embodiment, the current and voltage are measured at each time step, k. The time step, k, represents the current time step, the time steps k−1 and k+1 represent the previous and future time step, respectively, relative to the k time step. Thus the current and voltage are sampled in discrete time steps, and the model-based SOC estimate, $SOC_{B,k}$, and the model-based standard error, $SE_{B,k}$, are determined for each time step, k.

It is noted that in FIG. 2, there is no aggregation module for a single cell. Therefore, in this example embodiment, $$SOC_{A,k} = SOC_{B,k}$$

The cell adaptation module 210 may be configured for a single cell to receive the measured current $I_{M,k}$, the model-based SOC estimate, $SOC_{B,k}$, and the previous adaptive SOC estimate, $SOC_{C,k-1}$, and to generate an adaptation current $I_{A,k}$. For example, a difference or error "e" may be calculated as:

$$e_k = SOC_{C,k-1} - SOC_{B,k}$$

The single cell adaptation current $I_{A,k}$ may then be calculated as:

$$I_{A,k} = |I_{M,k}| * K_{M,k} * e_k + \max(e_k, 0) * I_{d,k} * K_{d,k}$$

In an example embodiment, the variables $K_{m,k}$ and $K_{d,k}$, represents tunable constants that can be continuously updated to provide optimal convergence. The term $|I_{M,k}| * K_{m,k} * e_k$, for example, accounts for SOC drift during operating and may be configured to gradually adjust $I_A$ to account for current measurement error. The term $\max(e_k, 0) * I_{d,k} * K_{d,k}$ on the other hand, is configured to make adjustments to $I_A$ based on the self-discharge of the ESS. In an example embodiment, the term $\max(e_k, 0)$ ensures that during rest, the SOC will remain constant or slightly decrease proportional to the self-discharge current. This ensures that the adaptive SOC estimate behaves logically under all operating conditions.

In an example embodiment, the cell adaptation module 210 may provide the adaptation current, $I_A$, to the cell accumulation module 208.

The cell accumulation module 208 may be configured to receive the measured current $I_M$ and the adaptation current $I_A$, and to generate an adaptive SOC estimate, $SOC_C$. For example, cell accumulation module 208 may be configured to perform adaptive coulomb counting to determine an adaptive SOC estimate, $SOC_C$.

$$SOC_{C,k} = SOC_{C,k-1} - \frac{(I_{M,k} + I_{A,k})\Delta t}{3600 * Cap_{cell,k}}$$

where $Cap_{cell,k}$ is the capacity of the cell, and $\Delta t$ is an accumulation time step. The $Cap_{cell,k}$ may be assigned statically based upon the cell nameplate ratings, may be updated dynamically based upon measured charge flow over a full discharge cycle, or may be estimated using other suitable capacity estimation approaches. Thus, in one example embodiment, the formula represents adaptive coulomb counting. Moreover, any suitable formulas for generating an adaptive SOC estimate, $SOC_C$, may be used. The cell accumulation module 208 may provide the adaptive SOC estimate, $SOC_C$, to the cell adaptation module 210 and to the cell tracking module 230.

The cell tracking module 230 may be configured to receive the model-based $SOC_B$, the standard error estimate, $SE_B$, and the adaptive SOC estimate, $SOC_C$, and to generate an upper confidence limit $L_U$, a lower confidence limit, $L_L$, and an overall tracking indicator T. For example, $$L_{U,k} = SOC_{B,k} \alpha_k * SE_{B,k}$$

$$L_{L,k} = SOC_{B,k} - \alpha_k * SE_{B,k}$$

where $\alpha_k$ is the critical value for the desired confidence limits, and wherein $\alpha_k$ can change over time. The $SE_{B,k}$ is the corresponding standard error for $SOC_{B,k}$. In accordance with an example embodiment, adaptive coulomb counting SOC estimation, $SOC_C$, is tracking if the following condition is met.

$$L_{L,k} < SOC_{c,k} < L_{U,k}$$

Where this condition is true, the tracking indicator, T, will be set to indicate that the $SOC_{C,k}$ is tracking the battery model, including expected self-discharge. Moreover, any suitable formulas for generating an upper confidence limit $L_U$, a lower confidence limit, $L_L$, and an overall tracking indicator T, may be used.

FIG. 3 is a block diagram illustrating an example state-of-charge estimation system for use with a single module. A single module SOC estimation system 300 is illustrated in the context of measuring the current and voltage(s) of a single module and estimating the SOC of that single module. In an example embodiment the single module SOC estimation system 300 comprises a current measurement module 302, voltage measurement circuit(s) 303, accumulation module 308, adaptation module 310, aggregation module 312, tracking module 330, and estimator module 305.

In an example embodiment, the current measurement module 302 is configured to measure a current from a single module and to generate a measured current $I_M$. The current measurement module 302 may provide the measured current $I_M$ to accumulation module 308, adaptation module 310, and estimator module 305. The measured current $I_M$ may reflect the current passing in series through each of the M cells in the module.

In an example embodiment, voltage measurement module 303 (e.g., voltage measurement circuit(s)) is configured to measure a voltage across a portion of the single module and to generate measured voltage(s) $V_1 \ldots M$. In an example embodiment with M individually measurable cells in the module, voltage measurement module 303 (e.g., voltage measurement circuits) may provide voltage measurements for each cell in the module, $V_1, V_2, \ldots V_M$. These voltage measurements can be considered a vector of M voltage measurements. The voltage measurement module 303 may provide the measured voltage to the estimator module 305.

The estimator module 305, similar to estimator module 105, may be configured to receive the measured current $I_M$ and measured voltages, $V_1 \ldots M$, and to generate a model-based SOC estimate, $SOC_B$, and a model-based standard error, $SE_B$. In an example embodiment, the estimator module 305 takes a vector of M voltage measurements with a current measurement and outputs a vector of M model-based SOC estimates ($SOC_B$) and a vector of M standard errors ($SE_B$).

The estimator module 305 may provide the vector of model-based SOC estimates, $SOC_{B,1\ldots M}$, to the aggregation module 312 and the tracking module 330. The estimator module 305 may provide the vector of model-based standard errors, $SE_{B,1\ldots M}$, to the tracking module 330.

In another example embodiment, the estimator module 305 can comprise a plurality of M estimators, where each receives the measured current $I_M$ and one of the measured voltages $V_{1\ldots M}$, and wherein each outputs a corresponding model-based SOC estimate, $SOC_{B,1\ldots M}$, and standard error estimate, $SE_{B,1\ldots M}$, which are provided to aggregation module 312 and tracking module 330 as described above.

The aggregation module 312 may be configured to receive the model-based SOC estimate, $SOC_B$, and to generate the aggregated SOC estimate, $SOC_A$. In an example embodiment, the capacity of a module is calculated as:

$$Cap_{module,k} = \min_{1 \leq x \leq M}(SOC_{B,x,k} * Cap_{x,k}) + \min_{1 \leq y \leq M}((1 - SOC_{B,y,k}) * Cap_{y,k})$$

where $Cap_{x,k}$ and $Cap_{y,k}$ represent cell capacity. The term $\min_{1 \leq x \leq M}(SOC_{B,x,k} * Cap_{x,k})$ calculates the charge that may still be removed from the module (without over discharging the least charged cell). The term $\min_{1 \leq y \leq M}((1 - SOC_{B,y,k}) * Cap_{y,k})$ calculates the charge that may still be accepted by the module (without over-charging the most charged cell). The module capacity is then the sum of these two terms. The $Cap_{x,k}$ and $Cap_{y,k}$ terms may be assigned statically based upon the cell nameplate ratings, may be updated dynamically based upon measured charge flow over a full discharge cycle, or may be estimated using any other suitable capacity estimation approach.

In another example embodiment, rather than calculate $Cap_{module,k}$ as above, $Cap_{module,k}$ may be assigned statically based upon the module nameplate ratings, may be updated dynamically based upon measured charge flow over a full discharge cycle, or may be estimated using any other suitable capacity estimation approach.

Based on this, the aggregation module 312 for the single module, may generate the aggregated SOC, $SOC_A$, as the ratio of the remaining module capacity to the total module capacity. For example:

$$SOC_{A,k} = \frac{\min_{1 \leq x \leq M}(SOC_{B,x,k} * Cap_{x,k})}{Cap_{module,k}}$$

Moreover, aggregation module 312 may be configured to determine the aggregated SOC estimate, $SOC_A$, based on the model-based SOC estimate, $SOC_B$, using any suitable formulas.

The adaptation module 310 may be configured to receive the measured current $I_M$, for a single module, receive the aggregated SOC estimate, $SOC_A$, and receive the adaptive SOC estimate, $SOC_C$, and to generate an adaptation current $I_A$. In an example embodiment, adaptation module 310 is configured to determine or calculate a difference, or error, between the previous adaptive SOC estimate, $SOC_{C,k-1}$, and the aggregated SOC estimate, $SOC_{A,k}$. This error may be calculated as follows:

$$e_k = SOC_{C,k-1} - SOC_{A,k}$$

In an example embodiment, the error may be used to calculate the adaptation current $I_A$, as follows:

$$I_{A,k} = |I_{M,k}| * K_{M,k} * e_k + \max(e_k, 0) * I_{d,k} * K_{d,k}$$

where $K_{M,k}$ and $K_{d,k}$ are tunable constants that can change dynamically based on the operating conditions and $I_{d,k}$ is a variable that accounts for the battery management system current draw as well as module level self-discharge (as further described with reference to adaptation module 110, 210). Moreover, $I_{A,k}$ can be calculated using any suitable equations that account for SOC drift due to current measurement error and module self-discharge. The adaptation module 310 may provide the adaptation current, $I_A$, to the accumulation module 308.

In an example embodiment, the accumulation module 308 may be configured to receive the measured current $I_M$ and the adaptation current $I_A$, and to generate an adaptive SOC estimate, $SOC_C$. For example, accumulation module 308 may be configured to perform adaptive coulomb counting to determine an adaptive SOC estimate, $SOC_C$ for the module.

$$SOC_{C,k} = SOC_{C,k-1} - \frac{(I_{M,k} + I_{A,k})\Delta t}{3600 * Cap_{module,k}}$$

where $Cap_{module,k}$ is the capacity of the module, and $\Delta t$ is an accumulation time step. Moreover, any suitable formulas for generating an adaptive SOC estimate, $SOC_C$, may be used. The accumulation module 308 may provide the adaptive SOC estimate, $SOC_C$, to the adaptation module 310 and to the tracking module 330.

The tracking module 330 may be a tracking circuit configured to track the estimated state-of-charge based on an upper confidence limit and a lower confidence limit. The tracking module 330 may be configured to receive M model-based SOC estimates, $SOC_{B,1\ldots M}$, and M standard error estimates, $SE_{B,1\ldots M}$, and the adaptive SOC estimate, $SOC_C$, and to generate an upper confidence limit $L_U$, a lower confidence limit, $L_L$, and an overall tracking indicator T. For example, the confidence limits can be calculated as follows:

$$L_{L,k} = SOC_{B,min,k} - \alpha_k * SE_{B,min,k}$$

$$L_{U,k} = SOC_{B,max,k} + \alpha_k * SE_{B,max,k}$$

The $SOC_{B,min,k}$ is the SOC of the cell with the least remaining charge, e.g. $\min_{1 \leq x \leq N}(SOC_{B,x,k} * Cap_x)$. The $SOC_{B,max,k}$ is the SOC of the cell that can accept the least amount charge, e.g. $\min_{1 \leq y \leq N}((1 - SOC_{B,y,k}) * Cap_y)$. $\alpha_k$ is the critical value for the confidence limits and Cap is the cell capacity. The $SE_{B,min,k}$ and $SE_{B,max,k}$ are the corresponding standard errors for $SOC_{B,min,k}$ and $SOC_{B,max,k}$. Both of these variables can change dynamically over time. However, any suitable method of determining the lower and upper confidence limits may be used.

In an example embodiment, the adaptive coulomb counting SOC is tracking if the following condition is met.

$$L_{L,k} \leq SOC_{c,k} \leq L_{U,k}$$

The tracking module 330 may further be configured to provide an indicator, T, to provide an indication when the estimated state-of-charge is inside a range between the lower confidence limit and the upper confidence limit. Thus, in an example embodiment, the SOC estimation system is configured to measure a current related to a single module, voltages related to the cells in the single module, determine the adaptation current for the single module, estimate the state-of-charge in the single module, and provide an indication of whether or not the SOC estimation is tracking.

In an example embodiment, estimating the SOC of the energy storage device may include measuring a current and voltages related to each cell in the battery stack, and determining an adaptive SOC for the battery stack. FIG. 4 is a block diagram illustrating an example state-of-charge estimation system for use with a stack of cells. A stack of cells SOC estimation system 400 is illustrated in the context of measuring the current and voltages of a stack of cells and estimating the SOC of that stack of cells. In an example embodiment the stack of cells SOC estimation system 400 comprises a current measurement module 402, voltage measurement module 403, stack accumulation module 408, stack adaptation module 410, stack tracking module 430, stack aggregation module 412, and estimator module 405.

In an example embodiment, current measurement module 402 is configured to measure the current, $I_M$, into and/or out of a stack of cells. In an example embodiment, current measurement module 402 is configured to provide the current measurement, $I_M$, to stack accumulation module 408, stack adaptation module 410, and estimator module 405.

In an example embodiment, voltage measurement module 403 is configured to measure the voltage, V, across a cell. In an example embodiment with N cells, voltage measurement module 403 may provide a voltage measurement V for each cell, $V_1, V_2, \ldots V_N$. These voltage measurements can be considered a vector of N voltage measurements. In an example embodiment, each voltage measurement module 403 may generate voltage measurements for each time step a measurement is taken. Thus, voltage measurement module 403 may generate voltage measurements $V_{1-N,k}$. The voltage measurement module 403 is configured to provide the voltages, $V_{1-N}$, to estimator module 405.

The estimator module 405, similar to estimator module 105, may be configured to receive the measured current $I_{M,j}$ and measured voltages, $V_{1-N}$, and generate a vector of N model-based SOC estimates ($SOC_B$) and N standard error ($SE_B$). Estimator module 405 may be configured to provide the vector of model-based SOC estimates, $SOC_{B,1 \ldots N}$ to stack aggregation module 412 and/or stack tracking module 430. Moreover, the estimator module 405 may be configured to provide the model-based standard error, $SE_{B,1 \ldots N}$ to the stack tracking module 430.

In another example embodiment, the estimator module 405 can comprise a plurality of N estimators, where each receives the measured current $I_{M,j}$ and one of the measured voltages $V_{1 \ldots N}$, and wherein each outputs a corresponding model-based SOC estimate, $SOC_{B,1 \ldots N}$, and standard error estimate, $SE_{B,1 \ldots N}$, which are provided to stack aggregation module 412 and stack tracking module 430 as described above.

In an example embodiment, stack aggregation module 412 is configured to receive the model-based stack SOC estimates, $SOC_{B,1 \ldots N}$. Described another way, stack aggregation module 412 may be configured to receive a vector of model-based SOC estimates, $SOC_{B,1 \ldots N}$, from estimator module 405. In an example embodiment, the capacity of a stack is calculated as:

$$Cap_{stack,k} = \min_{1 \leq x \leq N}(SOC_{B,x,k}*Cap_{x,k}) + \min_{1 \leq y \leq N}((1-SOC_{B,y,k})*Cap_{y,k})$$

where $Cap_{x,k}$ and $Cap_{y,k}$ represent cell capacity. The term $\min_{1 \leq x \leq N}(SOC_{B,x,k}*Cap_{x,k})$ calculates the charge that may still be removed from the stack (without over discharging the least charged cell). The term $\min_{1 \leq y \leq N}((1-SOC_{B,y,k})*Cap_{y,k})$ calculates the charge that may still be accepted by the stack (without over-charging the most charged cell). The stack capacity is then the sum of these two terms. The $Cap_{x,k}$ and $Cap_{y,k}$ terms may be assigned statically based upon the cell nameplate ratings, may be updated dynamically based upon measured charge flow over a full discharge cycle, or may be estimated using any other suitable capacity estimation approach.

In another example embodiment, rather than calculate $Cap_{stack,k}$ as above, $Cap_{stack,k}$ may be assigned statically based upon the module nameplate ratings, may be updated dynamically based upon measured charge flow over a full discharge cycle, or may be estimated using any other suitable capacity estimation approach.

The aggregated stack SOC estimate, $SOC_A$, is then the ratio of the remaining stack capacity to the total stack capacity. For example, $$SOC_{A,k} = \frac{\min_{1 \leq x \leq N_{cell}}(SOC_{B,x,k}*Cap_x)}{Cap_{stack,k}}$$

In accordance with an example embodiment, for stack aggregation, stack aggregation module 412 may be configured to calculate the aggregated SOC estimate, $SOC_{A,k}$.

The stack adaptation module 410 may be configured to receive the measured current $I_M$, for a single module, receive the aggregated SOC estimate, $SOC_A$, and receive the adaptive SOC estimate, $SOC_C$, and to generate an adaptation current $I_A$. For example, an adaptation current determination circuit may determine a stack adaptation current for the energy storage device. The adaptation current may be a function of the measured current, $I_M$, the aggregated SOC estimate, $SOC_A$, and the adaptive SOC estimate, $SOC_C$. In an example embodiment, stack adaptation module 410 is configured to determine or calculate a difference, or error, between the previous adaptive SOC estimate, $SOC_{C,k-1}$, and the aggregated SOC estimate, $SOC_{A,k}$. This error, $e_k$, may be calculated as follows:

$$e_k = SOC_{C,k-1} - SOC_{A,k}$$

In an example embodiment, this error may be used to calculate the adaptation current, $I_A$, as follows:

$$I_{A,k} = |I_{M,k}|*K_{M,k}*e_k + \max(e_k, 0)*I_{d,k}*K_{d,k}$$

where $K_{M,k}$ and $K_{d,k}$ are tunable constants that can change dynamically based on the operating conditions and $I_{d,k}$ is a variable that accounts for the battery management system current draw as well as stack level self-discharge (as further described with reference to adaptation module 110, 210, 310). Moreover, $I_{A,k}$ can be calculated using any suitable equations that account for SOC drift due to current measurement error and ESS self-discharge. The stack adaptation module 410 may provide the stack adaptation current, $I_A$, to the accumulation module 408.

In an example embodiment, the stack accumulation module 408 is configured to receive the measured stack current $I_M$, and the stack adaptation current $I_A$, and to generate an adaptive SOC estimate, $SOC_C$, for a stack of cells. For example, stack accumulation module 408 may be configured to perform adaptive coulomb counting to determine an adaptive SOC estimate, $SOC_C$ for the stack.

$$SOC_{C,k} = SOC_{C,k-1} - \frac{(I_{M,k} + I_{A,k})\Delta t}{3600*Cap_{stack,k}}$$

where $Cap_{stack,k}$ is the capacity of the stack, and $\Delta t$ is an accumulation time step. Moreover, any suitable formulas for generating an adaptive SOC estimate, $SOC_C$, may be used.

Moreover, any suitable method of coulomb counting may be used to update the SOC of the energy storage system by adding the amount of charge going into or out of the stack within that period of time, but adjusted for the adaptation current to perform adaptive coulomb counting. The adaptation current $I_{A,k}$ may correct for offset errors in the current measurement or an incorrect initial state-of-charge estimate.

The accumulation module 408 may provide the adaptive SOC estimate, $SOC_C$, to the adaptation module 410 and to the tracking module 430.

The tracking module 430 may be a tracking circuit configured to track the estimated SOC based on an upper confidence limit and a lower confidence limit. The tracking module 430 may be configured to receive the model-based SOC estimate, $SOC_B$, and the standard error estimate, $SE_B$, and the adaptive SOC estimate, $SOC_C$, and to generate an upper confidence limit $L_U$, a lower confidence limit, $L_L$, and an overall tracking indicator T, for a stack of cells. The tracking circuit may, for example, receive a vector of state-of-charge standard error values, $SE_{b,1 \ldots j}$ from estimation module 405. In an example embodiment the lower and upper confidence limits are calculated as:

$$L_{L,k} = SOC_{B,min,k} - \alpha_k * SE_{B,min,k}$$

$$L_{U,k} = SOC_{B,max,k} + \alpha_k * SE_{B,max,k}$$

The $SOC_{B,min,k}$ is the SOC of the cell with the least remaining charge, e.g. $\min_{1 \leq x \leq N}(SOC_{B,x,k} * Cap_t)$. The $SOC_{B,max,k}$ is the SOC of the cell that can accept the least amount charge, e.g. $\min_{1 \leq y \leq N}((1-SOC_{B,y,k}) * Cap_y)$. $\alpha_k$ is the critical value for the confidence limits and Cap is the cell capacity. The $SE_{B,min,k}$ and $SE_{B,max,k}$ are the corresponding standard errors for $SOC_{B,min,k}$ and $SOC_{B,max,k}$. However, any suitable method of determining the lower and upper confidence limits may be used.

In an example embodiment, the adaptive coulomb counting SOC is tracking if the following condition is met.

$$L_{L,k} < SOC_{c,k} < L_{U,k}$$

The tracking module 430 may further be configured to provide an indicator, T, to provide an indication when the estimated state-of-charge is inside a range between the lower confidence limit and the upper confidence limit. Thus, in an example embodiment, the SOC estimation system is configured to measure a current related to a single stack, voltages related to the cells in the single stack, determine the adaptation current for the single stack, estimate the state-of-charge in the single stack, and provide an indication of whether or not the SOC estimation is tracking.

Figure 5:
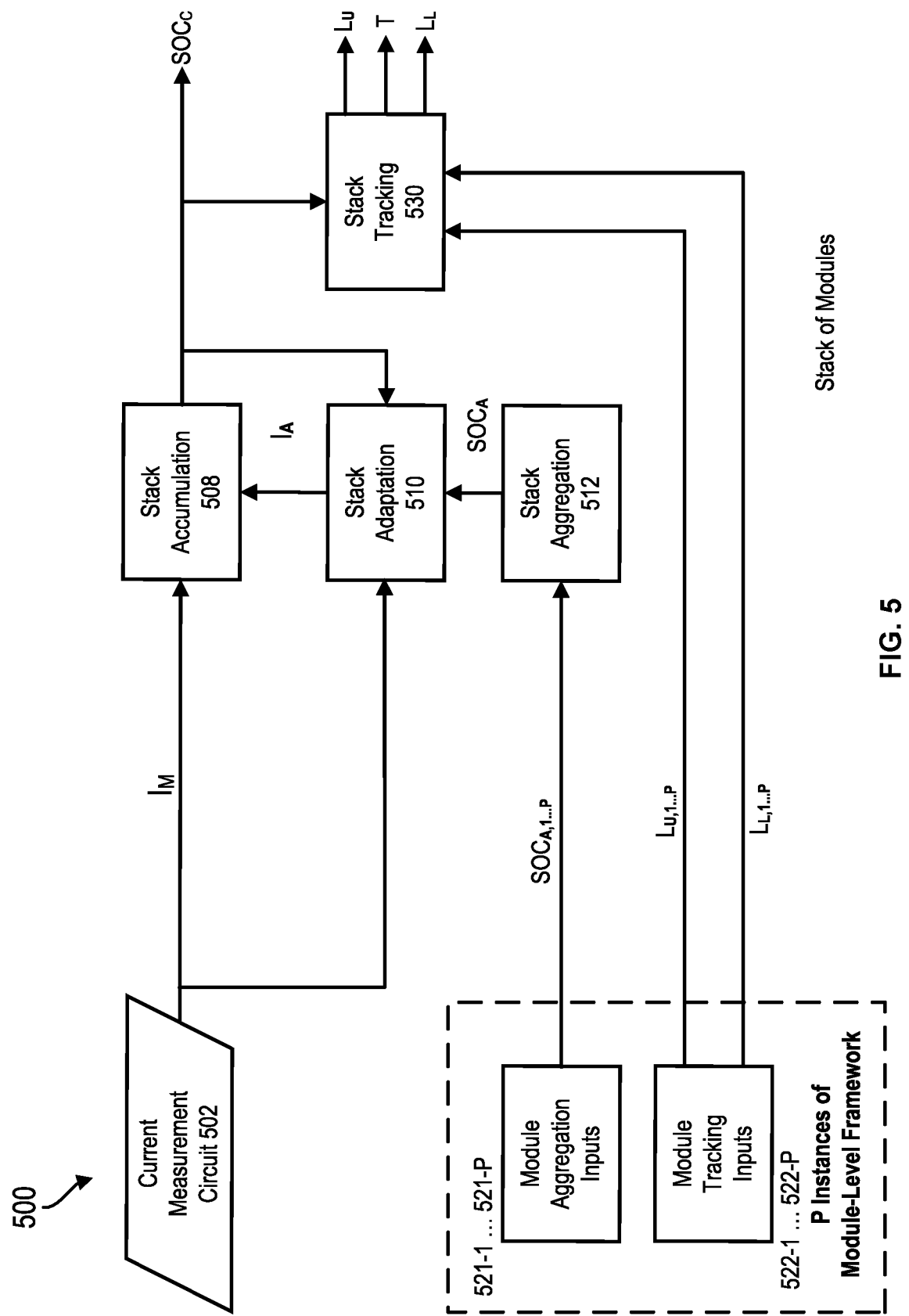
FIG. 5 is a block diagram illustrating an example state-of-charge estimation device for a stack of modules.

FIG. 5 is a block diagram illustrating an example SOC estimation system for use with a stack of modules. A stack of modules SOC estimation system 500 is illustrated in the context of measuring the current and voltages of a stack of modules and estimating the SOC of that stack of modules. In an example embodiment the stack of modules SOC estimation system 500, for a stack of P modules, comprises a current measurement module 502, module aggregation inputs 521-1 through 521-P, and module tracking inputs 522-1 through 522-P, stack accumulation module 508, stack adaptation module 510, stack aggregation module 512, and stack tracking module 530.

In an example embodiment, current measurement module 502 is configured to measure the current, $I_M$, into and/or out of a stack of modules. In an example embodiment, current measurement module 502 is configured to provide the current measurement, $I_M$, to stack accumulation module 508 and stack adaptation module 510.

In an example embodiment, the SOC estimation system 500 is configured to receive a series of module aggregated SOC estimates, $SOC_{A,1 \ldots P}$, from module aggregation inputs 521-1 through 521-P. These module aggregated SOC estimate inputs, $SOC_{A,1 \ldots P}$, may each correspond to an individual module aggregated SOC estimate, $SOC_A$, for the respective modules in the ESS. These module aggregation inputs, $SOC_{A,1 \ldots P}$, may be provided to stack aggregation module 512.

The stack aggregation module 512, may be an aggregation circuit. The aggregation circuit may be configured to receive module aggregated SOC estimates, $SOC_{A,1 \ldots P}$, and to generate an aggregated stack SOC estimate, $SOC_A$ based on the $SOC_{A,1 \ldots P}$. In an example embodiment, stack aggregation module 512 is configured to calculate the aggregated stack SOC estimate, $SOC_A$, using the state-of-charge estimations from the module level, as follows:

In an example embodiment, the capacity of a stack is calculated as:

$$Cap_{stack,k} = \min_{1 \leq x \leq P}(SOC_{A,x,k} * Cap_{x,k}) + \min_{1 \leq y \leq P}((1 - SOC_{A,y,k}) * Cap_{y,k})$$

where $Cap_{x,k}$ and $Cap_{y,k}$ represent module capacity. The term $\min_{1 \leq x \leq P}(SOC_{B,x,k} * Cap_{x,k})$ calculates the charge that may still be removed from the stack (without over discharging the least charged module). The term $\min_{1 \leq y \leq P}((1-SOC_{B,y,k}) * Cap_{y,k})$ calculates the charge that may still be accepted by the stack (without over-charging the most charged module). The stack capacity is then the sum of these two terms. In an example embodiment, the $Cap_{x,k}$ and $Cap_{y,k}$ terms may be assigned statically based upon the module nameplate ratings, may be updated dynamically based upon measured charge flow over a full discharge cycle, or may be estimated using any other suitable capacity estimation approach.

In another example embodiment, rather than calculate $Cap_{stack,k}$ as above, $Cap_{stack,k}$ may be assigned statically based upon the stack nameplate ratings, may be updated dynamically based upon measured charge flow over a full discharge cycle, or may be estimated using any other suitable capacity estimation approach.

The aggregated stack SOC estimate, $SOC_A$, is then the ratio of the remaining stack capacity to the total stack capacity. For example, $$SOC_{A,k} = \frac{\min_{1 \leq x \leq P_{cell}}(SOC_{B,x,k} * Cap_x)}{Cap_{stack,k}}$$

In accordance with an example embodiment, for stack aggregation, stack aggregation module 512 may be configured to calculate the aggregated SOC estimate, $SOC_{A,k}$. Moreover aggregation module 512 may be configured to determine the aggregated stack SOC estimate, $SOC_A$, based on the module aggregated SOC estimate inputs, $SOC_{A,1 \ldots P}$, using any suitable formulas.

The adaptation module 510 may be configured to receive the measured current $I_M$, receive the aggregated stack SOC estimate, $SOC_A$, and receive the adaptive SOC estimate, $SOC_C$, and to generate an adaptation current $I_A$. In an example embodiment, adaptation module 510 is configured to determine or calculate a difference, or error, between the previous adaptive SOC estimate, $SOC_{C,k-1}$, and the aggregated stack SOC estimate, $SOC_{A,k}$. This error may be calculated as follows:

$$e_k = SOC_{c,k-1} - SOC_{A,k}$$

In an example embodiment, the error may be used to calculate the adaptation current $I_A$, as follows:

$$I_{A,k}=|I_{M,k}|*K_{M,k}*e_k+\max(e_k,0)*I_{d,k}*K_{d,k}$$

where $K_{M,k}$ and $K_{d,k}$ are tunable constants that can change dynamically based on the operating conditions and $I_{d,k}$ is a variable that accounts for the battery management system current draw as well as stack level self-discharge (as further described with reference to adaptation module 110, 210, 310, 410).

Moreover, $I_{A,k}$ can be calculated using any suitable equations that account for SOC drift due to current measurement error and ESS self-discharge. The adaptation module 510 may provide the adaptation current, $I_A$, to the accumulation module 508.

In an example embodiment, the accumulation module 508 may be configured to receive the measured current $I_M$ and the adaptation current $I_A$, and to generate an adaptive SOC estimate, $SOC_C$. For example, accumulation module 508 may be configured to perform adaptive coulomb counting to determine an adaptive SOC estimate, $SOC_C$ for the module.

$$SOC_{C,k} = SOC_{C,k-1} - \frac{(I_{M,k} + I_{A,k})\Delta t}{3600 * Cap_{stack,k}}$$

Where $Cap_{stack,k}$ is the capacity of the stack, and $\Delta t$ is an accumulation time step. Moreover, any suitable formulas for generating an adaptive SOC estimate, $SOC_C$, may be used. The accumulation module 508 may provide the adaptive SOC estimate, $SOC_C$, to the adaptation module 510 and to the tracking module 530.

The tracking module 530 may be a tracking circuit configured to track the estimated state-of-charge based on an upper confidence limit and a lower confidence limit. The tracking module 530 may be configured to receive the adaptive SOC estimate, $SOC_C$. The tracking module 530 may also be configured to receive to receive the upper confidence limit inputs, $L_{U,1\ldots P}$, and lower confidence limit inputs, $L_{L,1\ldots P}$, from module tracking inputs 522-1 ... 522-P. These confidence limit inputs are the outputs of individual module tracking, as described with reference to FIG. 3.

In an example embodiment, the tracking module 530 is configured to generate an upper confidence limit $L_U$, a lower confidence limit, $L_L$, and an overall tracking indicator T. For example, the confidence limits can be calculated as follows:

$$L_{L,k}=\min_{1\leq x\leq P}(L_{L,x,k})$$

$$L_{U,k}=\max_{1\leq x\leq P}(L_{U,x,k})$$

where the $L_L$ is the minimum lower confidence limit of all of the individual module lower confidence limits, and the $L_U$ is the maximum upper confidence limit of all of the individual module upper confidence limits. However, any suitable method of determining the lower and upper confidence limits may be used.

The adaptive coulomb counting SOC is tracking if the following condition is met.

$$L_{L,k}<SOC_{C,k}<L_{U,k}$$

The tracking module 530 may further be configured to provide an indicator, T, to provide an indication when the estimated state-of-charge is inside a range between the lower confidence limit and the upper confidence limit.

Figure 6:
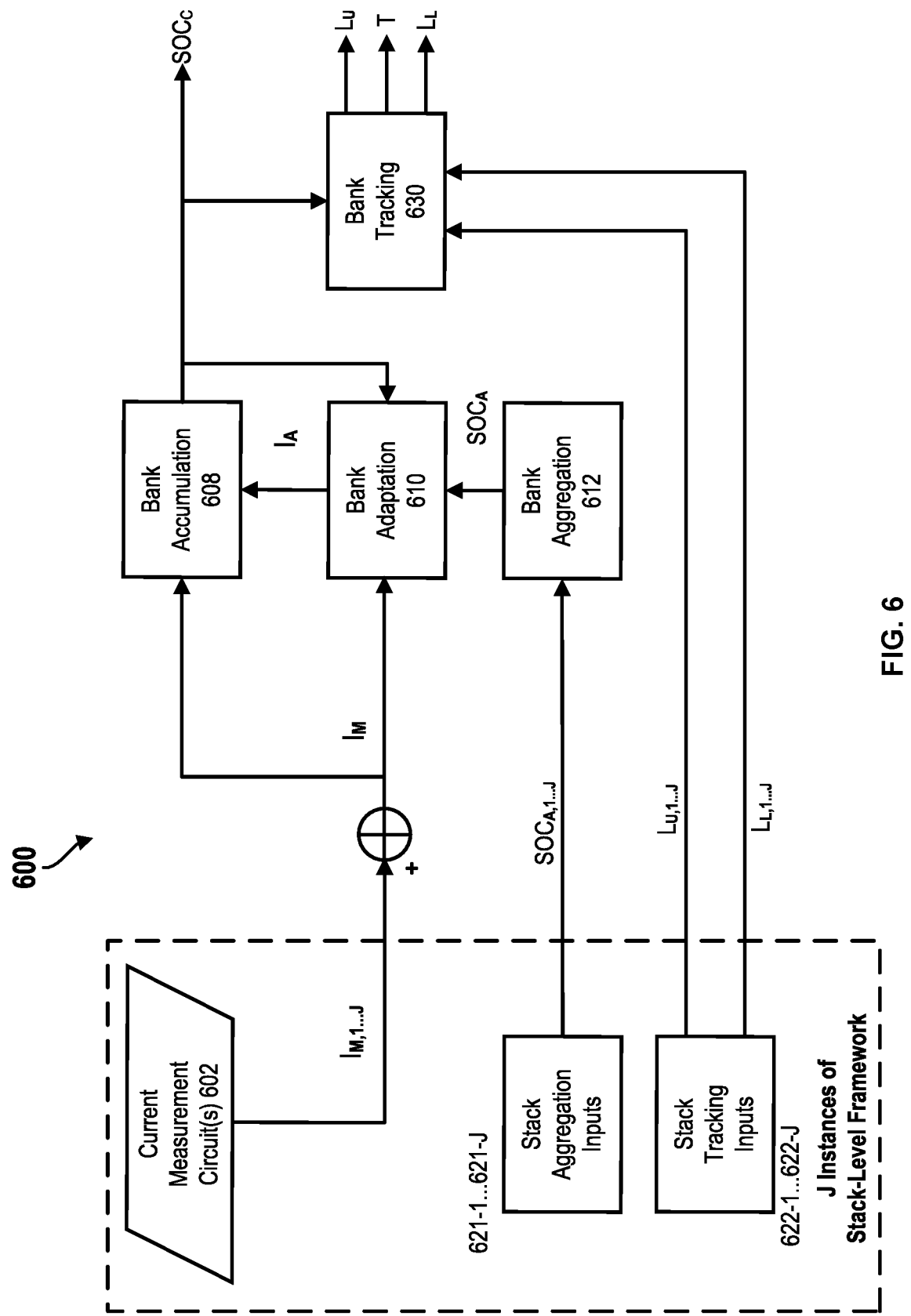
FIG. 6 is a block diagram illustrating an example state-of-charge estimation device at a bank level.

In an example embodiment, measuring the current related to the energy storage device may include measuring a current related to a bank of battery stacks, determining an adaptation current for the bank of battery stacks, and estimating the state-of-charge in the bank of battery stacks. FIG. 6 is a block diagram illustrating an example state-of-charge estimation system 600 at the bank level. The illustrated example SOC estimation system 600 at the bank level includes a current measurement circuit(s) 602, a series of stack-level aggregation inputs 621-1 to 621-J, a series of stack-level tracking inputs 622-1 to 622-J, a bank accumulation module 608, a bank adaptation module 610, a bank aggregation module 612, and a bank tracking module 630.

In an example embodiment, current measurement circuit(s) 602 measure the current to or from a stack of cells or modules. Thus, $I_{M,1}$ represents the current to or from a first stack, and $I_{M,J}$ represents the current to or from a Jth stack. The currents $I_{M,1}$ through $I_{M,J}$ may be summed at a summer. In another example embodiment, a current sensor may measure the current from the entire bank. The current measurement circuit(s) 602 may provide the measured current, $I_{M,1-J}$, to the bank accumulation module 608 and the bank adaptation module 610. Moreover, the measured current from each kth time steps is, and/or from each stack, is summed to provide a measured current.

In an example embodiment, the SOC estimation system 600 is configured to receive a series of stack aggregated SOC estimates, $SOC_{A,1\ldots J}$, from stack aggregation inputs 621-1 to 621-J. These stack aggregation inputs 621-1 to 621-J may each correspond to an individual stack aggregated SOC estimate, $SOC_A$, for the respective stacks in the ESS. These stack aggregation inputs may be provided to bank aggregation module 612.

The bank aggregation module 612, may be an aggregation circuit. The bank aggregation module 612 may be configured to receive the series of stack aggregated SOC estimates, $SOC_{A,1\ldots J}$, from stack aggregation inputs 621-1 to 621-J, and to generate a bank aggregated bank SOC estimate, $SOC_A$, based on the J stack aggregated SOC estimates, $SOC_{A,1\ldots J}$. In an example embodiment, bank aggregation module 612 is configured to calculate the aggregated bank SOC estimate, $SOC_A$, using the SOC estimations from the stack level as follows:

In an example embodiment, the capacity of a bank is calculated as:

$$Cap_{bank,k}=\min_{1\leq x\leq J}(SOC_{A,x,k}*Cap_{x,k})+\min_{1\leq y\leq J}((1-SOC_{A,y,k})*Cap_{y,k})$$

where $Cap_{x,k}$ and $Cap_{y,k}$ terms represent stack capacity. The term $\min_{1\leq x\leq J}(SOC_{A,x,k}*Cap_{x,k})$ calculates the charge that may still be removed from the bank (without over discharging the least charged stack). The term $\min_{1\leq y\leq J}((1-SOC_{A,y,k})*Cap_{y,k})$ calculates the charge that may still be accepted by the bank (without over-charging the most charged stack). The bank capacity is then the sum of these two terms. The $Cap_{x,k}$ and $Cap_{y,k}$ terms may be assigned statically based upon the stack nameplate ratings, may be updated dynamically based upon measured charge flow over a full discharge cycle, or may be estimated using any other suitable capacity estimation approach.

In another example embodiment, rather than calculate $Cap_{bank,k}$ as above, $Cap_{bank,k}$ may be assigned statically based upon the bank nameplate ratings, may be updated dynamically based upon measured charge flow over a full discharge cycle, or may be estimated using any other suitable capacity estimation approach.

The aggregated stack SOC estimate, $SOC_A$, is then the ratio of the remaining bank capacity to the total bank capacity. For example, $$SOC_{A,k} = \frac{\min_{1 \leq x \leq J}(SOC_{A,x,k} * Cap_x)}{Cap_{bank,k}}$$

Moreover aggregation module 612 may be configured to determine the aggregated bank SOC estimate, $SOC_A$, based on the stack aggregated SOC estimates, $SOC_{A,1\ldots J}$, using any suitable formulas. The aggregated bank SOC estimate, $SOC_A$, may be provided to the bank adaptation module 610.

The bank adaptation module 610 may be a circuit that determines an adaptation current, e.g., at the bank level. In an example embodiment, bank adaptation module 610 is configured to receive current measurements $I_{M,1\ldots J}$, aggregated SOC estimate, $SOC_A$, and an adaptive SOC estimate, $SOC_C$. In this example embodiment, adaptation module 610 is configured to generate an adaptation current, $I_A$, for the energy storage device. The adaptation current, $I_A$, may be a function of current measurements $I_{M,1\ldots J}$, aggregated SOC estimate, $SOC_A$, and the adaptive SOC estimate, $SOC_C$. For example, bank adaptation module 610 may determine a difference or error, $e_k$, between the previous adaptive SOC estimate, $SOC_{C,k-1}$, and an aggregated SOC estimate, $SOC_{A,k}$, of the bank.

$$e_k = SOC_{C,k-1} - SOC_{A,k}$$

In an example embodiment, the bank adaptation module 610 may determine the adaptation current $I_A$, at least in part, on this calculated error, e.g., $e_k$. In an example embodiment, the adaptation current $I_A$ may be calculated as follows:

$$I_{A,k} = |I_{M,k}| * K_{m,k} * e_k + \max(e_k, 0) * I_{d,k} * K_{d,k}$$

where $K_{M,k}$ and $K_{d,k}$ are tunable constants that can change dynamically based on the operating conditions (as further described with reference to adaptation module 110, 210, 310, 410, 510, 610). $I_{d,k}$ is a variable that accounts for the battery management system current draw as well as bank level self-discharge similar to the discussion related to adaptation module 110. Moreover, $I_{A,k}$ can be calculated using any suitable equations that account for SOC drift due to current measurement error and ESS self-discharge. The bank adaptation module 610 may provide the adaptation current, $I_{A-bank}$, to the bank accumulation module 608.

The bank accumulation module 608 may be configured to receive the measured current $I_{M,1\ldots J}$ and the adaptation current $I_A$. The bank accumulation module 608 may be configured to generate an adaptive bank SOC estimate, $SOC_C$. In an example embodiment, the bank accumulation module 608 may be configured to generate the adaptive bank SOC estimate, $SOC_C$, based on the measured current $I_{M,1\ldots J}$ and the adaptation current $I_{A-bank}$. The adaptation current $I_A$ may correct for errors in the measured current $I_{M,1\ldots J}$ or other errors in coulomb counting current measurements. For example, accumulation module 608 may be configured to perform adaptive coulomb counting to determine an adaptive bank SOC estimate, $SOC_C$.

Bank accumulation module 608 may comprise a state-of-charge estimation circuit to estimate the state-of-charge in the energy storage device. The state-of-charge estimate may be based on the measured bank current and the adaptation bank current. The estimated state-of-charge may be further based on an integration of an additive combination of the measured bank current and the adaptation bank current. This may be represented, for example, by:

$$SOC_{C,k} = SOC_{C,k-1} - \frac{(I_{M,k} + I_{A,k})\Delta t}{3600 * Cap_{bank,k}}$$

wherein $Cap_{bank,k}$ is the capacity of the bank, and $\Delta t$ is accumulation time step over which the integration is performed. Moreover, any suitable formulas for generating an adaptive bank SOC estimate, $SOC_C$, may be used. The accumulation module 608 may provide the adaptive bank SOC estimate, $SOC_C$, to the adaptation module 610 and to the tracking module 630.

The bank tracking module 630 may be a tracking circuit configured to track the estimated SOC based on an upper confidence limit and a lower confidence limit. The tracking module 630 may be configured to receive the adaptive bank SOC estimate, $SOC_C$. The tracking module 630 may also be configured to receive to receive the upper confidence limit inputs, $L_{U,1\ldots P}$, and lower confidence limit inputs, $L_{L,1\ldots P}$, from stack tracking inputs 622-1 . . . 622-P. These confidence limit inputs are the outputs of individual stack tracking, as described with reference to FIG. 4.

In an example embodiment, the tracking module 530 is configured to generate an upper confidence limit $L_U$, a lower confidence limit, $L_L$, and an overall tracking indicator T. In an example embodiment, upper limit, $L_U$, represents the upper confidence limit, and the lower limit, $L_L$, represents the lower confidence limit for the bank and are calculated as follows:

$$L_{L,k} = \min_{1 \leq x \leq J}(L_{L,x,k})$$

$$L_{U,k} = \max_{1 \leq x \leq J}(L_{U,x,k})$$

where the $L_L$ is the minimum lower confidence limit of all of the individual stack lower confidence limits, and the $L_U$ is the maximum upper confidence limit of all of the individual stack upper confidence limits.

Thus, the bank tracking module 630 may be configured to determine and/or notify users whether the estimated bank state-of-charge $SOC_C$ is tracking well, based on the upper confidence limit and lower confidence limit. The bank tracking module 614 may further provide an indicator, T, configured to provide an indication when the estimated state-of-charge is inside a range between the lower confidence limit and the upper confidence limit. The adaptive coulomb counting SOC is tracking if the following condition is met.

$$L_{L,k} < SOC_{c,k} < L_{U,k}$$

In an example embodiment, SOC estimation systems and methods described herein may be compensated for to reduce or eliminate errors, e.g., using an adaptation current. For example, adaptive coulomb counting systems and methods may be used with both a measured current and a calculated adaptation current. The measured current and the calculated adaptation current may be combined to produce a well-behaved state-of-charge estimate. The adaptation current may be determined by taking a fraction of the measured current based on the calculated error. In an example embodiment, the calculated error may be obtained by taking the difference between the adaptive SOC estimate and an aggregated state-of-charge estimate.

Figure 7:
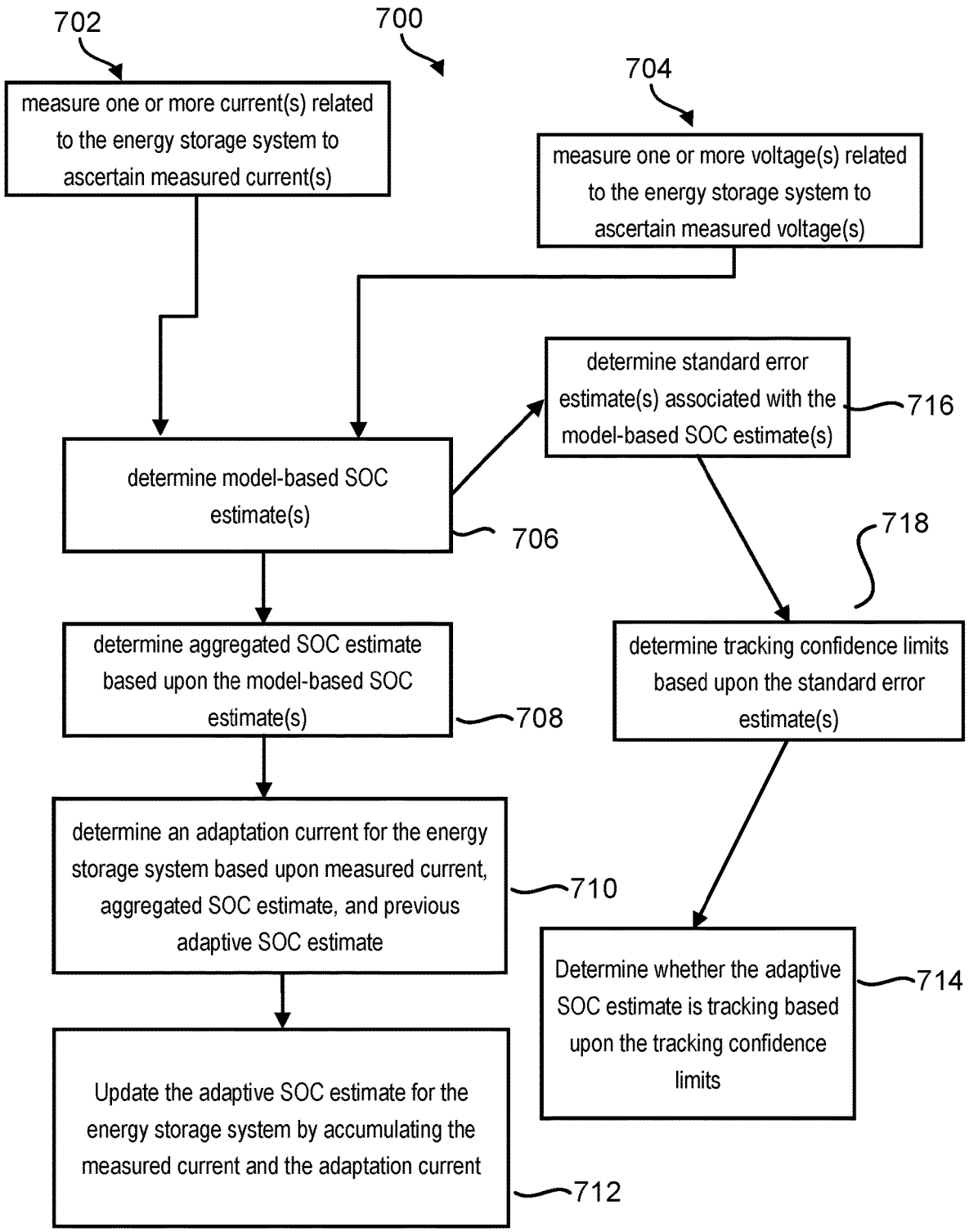
FIG. 7 is a flow diagram illustrating an example method.

FIG. 7 is a flow diagram illustrating an example method 700 of estimating a state-of-charge in an energy storage device. The example method includes measuring one or more current(s) related to the energy storage system to ascertain a measured current(s) (702). For example, a current measurement module 102, 202, 302, 402, 502, or 602 may measure a current related to the energy storage system to ascertain a measured current. (See, for example, current $I_M$, $I_{M,1 \ldots J}$.) The current may be measured using a current measurement circuit.

In accordance with various example embodiments, the method may further comprise measuring one or more voltage(s) related to the energy storage system to ascertain measured voltage(s) (704).

In an example embodiment, the method further comprises determining a model-based state-of-charge estimate for the energy storage system (706). In one example embodiment, the model-based state-of-charge estimate may be made using a recursive Bayesian estimation as a general probabilistic approach for estimating an unknown probability distribution recursively over time using incoming measurements and a mathematical process model. In this example, determining a model-based state-of-charge estimate may comprise generating a distribution and an associated model-based standard error. (716)

Moreover, in an example embodiment, the method further comprises determining an aggregated state-of-charge estimate based upon the model-based state-of-charge estimate (708).

The method may further comprise determining an adaptation current for the energy storage system based on the measured current, the aggregated state-of-charge estimate and an adaptive state-of-charge estimate (710). For example, an adaptation module 210, 310, 410, 510, 610 may determine an adaptation current for the energy storage device, e.g., battery, capacitor, superconducting magnetic energy storage (SMES) systems, or any other energy storage device or other energy storage devices. Determining the adaptation current may further include determining an adaptation current for the energy storage system based on a self-discharge current. In an example embodiment, the method may further comprise determining the adaptation current to account for state-of-charge drift due to current measurement error and self-discharge of the energy storage system.

Moreover, in an example embodiment, the method further comprises updating the adaptive state-of-charge estimate based on the adaptation current and the measured current (712). This can be done, for example, by accumulating (or integrating an additive combination of) the measured current and the adaptation current.

The method may further comprise determining an upper confidence limit and a lower confidence limit based on the model-based state-of-charge estimate and the standard error (718), and providing a tracking signal that indicates whether the adaptive state-of-charge estimate is tracking between the upper confidence limit and lower confidence limit. (714) For example, a tracking module 230, 330, 430, 530, 630 may provide an indication such as an output, "Tracking," when the estimated state-of-charge is inside a range between the lower confidence limit and the upper confidence limit. For example, the upper confidence limit and the lower confidence limit may be defined by one of a highest stack and a lowest stack, or a highest cell and a lowest cell. Tracking verification and notification may be performed at one or more of a bank, a stack, a module, or a cell level.

In an example embodiment, measuring the current related to the energy storage device may include measuring a current related to a bank of battery stacks, determining the adaptation current for the energy storage device may include determining an adaptation current for the bank of battery stacks, and estimating the state-of-charge in the energy storage device may include estimating the state-of-charge in the bank of battery stacks.

In an example embodiment, measuring the current related to the energy storage device may include measuring a current related to a battery stack, determining the adaptation current for the energy storage device may include determining an adaptation current for the battery stack, and estimating the state-of-charge in the energy storage device may include estimating the state-of-charge in the battery stack.

In an example embodiment, measuring the current related to the energy storage device may include measuring a current related to a battery module, determining the adaptation current for the energy storage device may include determining an adaptation current for the battery module, and estimating the state-of-charge in the energy storage device may include estimating the state-of-charge in the battery module.

In an example embodiment, measuring the current related to the energy storage device may include measuring a current related to a single cell, determining the adaptation current for the energy storage device may include determining an adaptation current for the single cell, and estimating the state-of-charge in the energy storage device may include estimating the state-of-charge in the single cell.

Example embodiments of the systems, methods, and devices described herein may be implemented in hardware, software, firmware, or some combination of hardware, software, and firmware. For example, the block diagrams of FIGS. 2-6 may be implemented in hardware, software, firmware, or some combination of hardware, software, and firmware. For example, a module or combinations of modules in each of FIGS. 2-6 may be implemented in hardware, software, firmware, or some combination of hardware, software, and firmware. For example, the current measurement module 202 of FIG. 2 may be implemented in hardware, software, firmware, or some combination of hardware, software, and firmware. The accumulation module 208 of FIG. 2 may be implemented in hardware, software, firmware, or some combination of hardware, software, and firmware. In an example embodiment, the accumulation module 208 may be implemented on a processor (hardware) running code (software) causing the processor to calculate an integral of an input signal over time. Similarly, one or more modules in each of FIGS. 2-6 may include hardware, software, or some combination thereof. Furthermore, the method described with respect to FIG. 7 may be implemented in hardware, software, firmware, or some combination of hardware, software, and firmware.

In the present disclosure, the following terminology will be used: The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "about" means quantities, dimensions, sizes, formulations, parameters, shapes, and other characteristics need not be exact, but may be approximated and/or larger or smaller, as desired, reflecting acceptable tolerances, conversion factors, rounding off, measurement error and the like and other factors known to those of skill in the art. The term "substantially" means that the recited characteristic, parameter, or value need not be achieved exactly, but that deviations or variations, including, for example, tolerances, measurement error, measurement accuracy limitations and other factors known to those of skill in the art, may occur in amounts that do not preclude the effect the characteristic was intended to provide. Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but also include individual values and sub-ranges within the indicated range. Thus, included in the numerical range are individual values such as 2, 3 and 4 and sub-ranges such as 1-3, 2-4 and 3-5, etc. The same principle applies to ranges reciting only one numerical value (e.g., "greater than about 1") and should apply regardless of the breadth of the range or the characteristics being described. A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. The term "alternatively" refers to selection of one of two or more alternatives, and is not intended to limit the selection to only those listed alternatives or to only one of the listed alternatives at a time, unless the context clearly indicates otherwise.

It should be appreciated that the particular implementations shown and described herein are illustrative of the example embodiments and their best mode and are not intended to otherwise limit the scope of the present disclosure in any way. Furthermore, the connecting lines shown in the various figures contained herein are intended to represent exemplary functional relationships and/or physical couplings between the various elements. It should be noted that many alternative or additional functional relationships or physical connections may be present in a practical device.

As one skilled in the art will appreciate, the mechanism of the present disclosure may be suitably configured in any of several ways. It should be understood that the mechanism described herein with reference to the figures is but one exemplary embodiment of the disclosure and is not intended to limit the scope of the disclosure as described above.

It should be understood, however, that the detailed description and specific examples, while indicating exemplary embodiments of the present disclosure, are given for purposes of illustration only and not of limitation. Many changes and modifications within the scope of the instant disclosure may be made without departing from the spirit thereof, and the disclosure includes all such modifications. The corresponding structures, materials, acts, and equivalents of all elements in the claims below are intended to include any structure, material, or acts for performing the functions in combination with other claimed elements as specifically claimed. The scope of the disclosure should be determined by the appended claims and their legal equivalents, rather than by the examples given above. For example, the operations recited in any method claims may be executed in any order and are not limited to the order presented in the claims. Moreover, no element is essential to the practice of the disclosure unless specifically described herein as "critical" or "essential."

We claim:

1. A method of determining whether a state-of-charge estimate of an energy storage system is tracking, the method comprising:
    measuring, by a current measurement module comprising a current sensor, a current related to the energy storage system to ascertain a measured current;
    measuring, by a voltage measurement module comprising a voltage sensor, a voltage related to the energy storage system to ascertain a measured voltage;
    determining, by an estimator module, a model-based state-of-charge estimate for the energy storage system based on the measured current and the measured voltage;
    determining, by the estimator module, a model-based standard error based on the measured current and the measured voltage;
    determining, by a tracking module, an upper confidence limit and a lower confidence limit based on the model-based state-of-charge estimate and the model-based standard error; and
    providing, by the tracking module, a tracking signal that indicates whether an output state-of-charge estimate is tracking between the upper confidence limit and the lower confidence limit;
        wherein the estimator module and the tracking module are implemented on one or more processors.

2. The method of claim 1, wherein the output state-of-charge estimate is a coulomb counting state-of-charge estimate.

3. The method of claim 1, further comprising determining an aggregated state-of-charge estimate based upon the model-based state-of-charge estimate.

4. The method of claim 3, wherein the aggregated state-of-charge estimate is an aggregation of the model-based state-of-charge estimate.

5. The method of claim 3, wherein the output state-of-charge estimate is an adaptive state-of-charge estimate.

6. The method of claim 5, further comprising determining an adaptation current for the energy storage system based on the measured current, the aggregated state-of-charge estimate and the adaptive state-of-charge estimate.

7. The method of claim 6, further comprising determining the adaptive state-of-charge estimate based on the adaptation current and the measured current.

8. The method of claim 6, further comprising determining the adaptive state-of-charge estimate based on an integration of an additive combination of the measured current and the adaptation current.

9. The method of claim 6, further comprising determining the adaptation current to account for state-of-charge drift due to a current measurement error and self-discharge of the energy storage system.

10. The method of claim 6, further comprising determining the adaptation current based upon a calculated error that is based on a difference between the adaptive state-of-charge estimate and the aggregated state-of-charge estimate.

11. The method of claim 6, wherein determining the model-based state-of-charge estimate comprises generating a probability distribution with the associated model-based standard error.

12. The method of claim 1, further comprising controlling charging/discharging of the energy storage system based on whether the output state-of-charge estimate is tracking.

13. A device for determining whether a state-of-charge of an energy storage system is tracking, comprising:
   a current measurement circuit to measure a current related to the energy storage system to ascertain a measured current;
   a voltage measurement circuit to measure a voltage related to the energy storage system to ascertain a measured voltage;
   a tangible, non-transitory memory configured to communicate with one or more processors, the tangible, non-transitory memory having instructions stored thereon that, in response to execution by one or more of the processors, cause the processor to perform operations;
   an estimator module including at least one of the one or more processors, the estimator module configured to generate, by the one or more processors, a model-based state-of-charge estimate based on the measured current and the measured voltage, and configured to generate a model-based standard error based on the measured current and the measured voltage;
   a tracking module including at least one of the one or more processors, the tracking module configured to:
   (1) generate, by the one or more processors, an upper confidence limit and a lower confidence limit; and
   (2) provide a tracking signal that indicates whether an output state-of-charge estimate is tracking between the upper confidence limit and the lower confidence limit.

14. The device of claim 13, further comprising an accumulation module to update the output state-of-charge estimate based on the measured current, wherein the output state-of-charge estimate is a coulomb counting based state-of-charge estimate.

15. The device of claim 13, further comprising:
   an aggregation module to generate an aggregated state-of-charge estimate based on the model-based state-of-charge estimate;
   an adaptation module to generate an adaptation current based on the measured current, the aggregated state-of-charge estimate, and the output state-of-charge estimate; and
   an accumulation module to update the output state-of-charge estimate based on the measured current and the adaptation current, wherein the output state-of-charge estimate is an adaptive state-of-charge estimate.

16. The device of claim 15, wherein the aggregated state-of-charge estimate is an aggregation of the model-based state-of-charge estimate.

17. The device of claim 15, wherein the adaptive state-of-charge estimate is further based on an integration of an additive combination of the measured current and the adaptation current.

18. The device of claim 15, wherein the estimator module is configured to generate the model-based state-of-charge estimate based on a probability distribution, and the estimator module is further configured to generate the model-based standard error associated with the probability distribution.

19. A system for determining whether a state-of-charge of an energy storage system is tracking comprising:
   an energy storage system; and
   a device for generating an output state-of-charge estimate for the energy storage system, the device comprising:
      a current measurement circuit configured to measure a current related to the energy storage system to ascertain a measured current;
      a voltage measurement circuit configured to measure a voltage related to the energy storage system to ascertain a measured voltage;
      a tangible, non-transitory memory configured to communicate with one or more processors, the tangible, non-transitory memory having instructions stored thereon that, in response to execution by one or more of the processors, cause the processor to perform operations;
      an estimator module including at least one of the one or more processors, the estimator module configured to generate, by the one or more processors, a model-based state-of-charge estimate based on the measured current and the measured voltage, and configured to generate, by the one or more processors, a model-based standard error based on the measured current and the measured voltage; and
      a tracking module including at least one of the one or more processors, the tracking module configured to generate, by the one or more processors, an upper confidence limit and a lower confidence limit, and to provide a tracking signal that indicates whether the output state-of-charge estimate is tracking between the upper confidence limit and the lower confidence limit.

20. The system of claim 19, further comprising:
   an aggregation module to generate an aggregated state-of-charge estimate based on the model-based state-of-charge estimate;
   an adaptation module to generate an adaptation current based on the measured current, the aggregated state-of-charge estimate, and the output state-of-charge estimate; and
   an accumulation module to update the output state-of-charge estimate based on the measured current and the adaptation current, wherein the output state-of-charge estimate is an adaptive state-of-charge estimate.

21. The system of claim 20, wherein the aggregated state-of-charge estimate is an aggregation of a plurality of the model-based state-of-charge estimate.

* * * * *